United States Patent
Hagihara

(10) Patent No.: US 12,273,105 B2
(45) Date of Patent: Apr. 8, 2025

(54) VOLTAGE GENERATION CIRCUIT, IMAGE SENSOR, SCOPE, AND VOLTAGE GENERATION METHOD

(71) Applicant: OLYMPUS MEDICAL SYSTEMS CORP., Hachioji (JP)

(72) Inventor: Yoshio Hagihara, Nishitama-gun (JP)

(73) Assignee: OLYMPUS MEDICAL SYSTEMS CORP., Tokyo (JP)

( * ) Notice: Subject to any disclaimer, the term of this patent is extended or adjusted under 35 U.S.C. 154(b) by 50 days.

(21) Appl. No.: 18/140,308

(22) Filed: Apr. 27, 2023

(65) Prior Publication Data
US 2023/0353141 A1 Nov. 2, 2023

Related U.S. Application Data

(60) Provisional application No. 63/335,833, filed on Apr. 28, 2022.

(51) Int. Cl.
  *H02M 3/07* (2006.01)
  *H03K 17/06* (2006.01)
  *H03K 17/16* (2006.01)
  *H03K 17/687* (2006.01)

(52) U.S. Cl.
  CPC ....... *H03K 17/6872* (2013.01); *H03K 17/063* (2013.01); *H03K 17/162* (2013.01)

(58) Field of Classification Search
  None
  See application file for complete search history.

(56) References Cited

U.S. PATENT DOCUMENTS

| | | | | |
|---|---|---|---|---|
| 6,175,264 B1* | 1/2001 | Jinbo | ........ | H02M 3/073 327/536 |
| 6,642,773 B2* | 11/2003 | Lin | ........ | H02M 3/073 363/59 |
| 6,914,791 B1* | 7/2005 | Park | ........ | H02M 3/073 363/60 |
| 7,714,636 B2* | 5/2010 | Chang | ........ | H02M 3/073 327/536 |
| 8,128,556 B2* | 3/2012 | Kimoto | ........ | A61B 5/073 600/179 |
| 11,877,053 B2* | 1/2024 | Hagihara | ........ | H01L 27/04 |

FOREIGN PATENT DOCUMENTS

JP  2006-129127 A  5/2006

* cited by examiner

*Primary Examiner* — Jeffrey S Zweizig
(74) *Attorney, Agent, or Firm* — WHDA, LLP

(57) ABSTRACT

A voltage generation circuit includes a booster circuit, a control buffer circuit, and a driving buffer circuit. The booster circuit includes a capacitance element and a transistor. The booster circuit generates a higher first voltage than the power source voltage, and the control buffer circuit controls the transistor by using a third voltage that is lower than the first voltage and is higher than a ground voltage. Alternatively, the booster circuit generates a lower second voltage than the ground voltage, and the control buffer circuit controls the transistor by using a fourth voltage that is higher than the second voltage and is lower than or equal to the ground voltage.

9 Claims, 12 Drawing Sheets

VOLTAGE GENERATION CIRCUIT, IMAGE SENSOR, SCOPE, AND VOLTAGE GENERATION METHOD

Priority is claimed on U.S. Provisional Patent Application Ser. No. 63/335,833, filed on Apr. 28, 2022, the content of which is incorporated herein by reference.

FIELD OF THE INVENTION

The present invention relates to a voltage generation circuit, an image sensor, a scope, and a voltage generation method.

DESCRIPTION OF RELATED ART

Physical-quantity detection semiconductor devices having sensors sensitive to externally input electromagnetic waves (light, radiation, etc.) are used in various fields. A physical quantity is converted into an electrical signal by a sensor. For example, a sensor in an imaging device is a pixel. In general, electrical signals of a reference level and a signal level are read from the sensor. For example, the reference level in the imaging device is a reset level.

A charge-coupled device (CCD) type imaging device has been generally used in an endoscope system. Since the CCD-type imaging device requires multiple power source voltages, there is a limit to miniaturization of the CCD-type imaging device. In order to solve this, complementary metal-oxide-semiconductor (CMOS) type imaging devices driven by a single power source voltage (for example, 3.3 [V]) have been used in recent years.

The amount of electric charge stored in a photo diode and a floating diffusion reduces as a pixel size reduces. Therefore, a signal-to-noise (S/N) ratio reduces, and image quality deteriorates. It is considered to use a higher voltage (high voltage) than a power source voltage (for example, 3.3 [V]) or a lower voltage (negative voltage) than a ground voltage instead of increasing the pixel size in order to increase the amount of electric charge to be stored.

A technique disclosed in Japanese Unexamined Patent Application, First Publication No. 2006-129127 provides an imaging device including a voltage generation circuit. FIG. 12 shows a configuration of a voltage generation circuit 1008 using the technique. The voltage generation circuit 1008 shown in FIG. 12 includes a control buffer unit 1100, a driving buffer unit 1200, a booster circuit 1300, a voltage comparison unit 1400, a capacitance element C43, a switching element SW44, and a switching element SW45.

The control buffer unit 1100 includes a control buffer 1110 and a control buffer 1120. A power source voltage and a negative voltage are input to the control huller 1110 and the control buffer 1120. The power source voltage is higher than a ground voltage VSS. The negative voltage is generated by the booster circuit 1300 and is lower than the ground voltage VSS. The control buffer 1110 outputs a control signal PSW41 having a high (H) voltage or a low (L) voltage to the booster circuit 1300. The control buffer 1120 outputs a control signal PSW42 having either the H voltage or the L voltage to the booster circuit 1300. The H voltage of each control signal is the power source voltage, and the L voltage of each control signal is the negative voltage.

The driving buffer unit 1200 includes a driving buffer 1210 and a driving huller 1220. The power source voltage and the ground voltage VSS are input to the driving buffer 1210 and the driving buffer 1220. The driving buffer 1210 outputs a driving signal PCK41 having either the H voltage or the L voltage to the booster circuit 1300. The driving buffer 1220 outputs a driving signal PCK42 having either the H voltage or the L voltage to the booster circuit 1300. The H voltage of each driving signal is the power source voltage, and the L voltage of each driving signal is the ground voltage VSS.

The booster circuit 1300 includes a switching element SW41, a switching element SW42, a switching element SW43, a capacitance element C41, and a capacitance element C42. The booster circuit 1300 is a charge-pump-type booster circuit including a plurality of pumping packets. Each of the pumping packets includes a switching element (transistor) and a capacitance element.

The ground voltage VSS is input to the switching element SW41. The state of the switching element SW41 is controlled based on the control signal PSW41. The state of the switching element SW42 is controlled based on the control signal PSW42. The state of the switching element SW43 is controlled based on the control signal PSW41.

The capacitance element C41 is driven based on the driving signal PCK41. The capacitance element C42 is driven based on the driving signal PCK42. Each of the capacitance elements includes a first terminal and a second terminal.

The voltage of the control signal PSW42 is set to the voltage, and the state of the switching element SW42 is set to an OFF state. Thereafter, the voltage of the control signal PSW41 is set to the H voltage, and the state of the switching element SW41 is set to an ON state. At this time, the ground voltage VSS is input to the first terminal of the capacitance element C41 via the switching element SW41. Thereafter, the voltage of the driving signal PCK41 is set to the H voltage, and the power source voltage is input to the second terminal of the capacitance element C41.

The voltage of the control signal PSW41 is set to the L voltage, and the state of the switching element SW41 is set to the OFF state. Thereafter, the voltage of the control signal PSW42 is set to the H voltage, and the state of the switching element SW42 is set to the ON state.

The voltage of the driving signal PCK41 is set to the L voltage, and the ground voltage VSS is input to the second terminal of the capacitance element C41. When the voltage of the driving signal PCK41 changes from the H voltage to the L voltage, the voltage generated by the pumping packet including the capacitance element C41 decreases. A lower negative voltage than the ground voltage VSS is generated at the first terminal of the capacitance element C41.

The negative voltage generated at the first terminal of the capacitance element C41 is input to the first terminal of the capacitance element C42 via the switching element SW42. Thereafter, the voltage of the driving signal PCK42 is set to the H voltage, and the power source voltage is input to the second terminal of the capacitance element C42.

The voltage of the control signal PSW42 is set to the L voltage, and the state of the switching element SW42 is set to the OFF state. Thereafter, the voltage of the control signal PSW41 is set to the H voltage, and the state of the switching element SW43 is set to the ON state.

The voltage of the driving signal PCK42 is set to the L voltage, and the ground voltage VSS is input to the second terminal of the capacitance element C42. When the voltage of the driving signal PCK42 changes from the H voltage to the L voltage, the voltage generated by the pumping packet including the capacitance element C42 decreases. A lower negative voltage than the negative voltage generated at the first terminal of the capacitance element C41 is generated at the first terminal of the capacitance element C42.

The negative voltage generated at the first terminal of the capacitance element C42 is input to the capacitance element C43 via the switching element SW43. The booster circuit 1300 generates a lower negative voltage than the ground voltage VSS. The capacitance element C43 holds the negative voltage generated by the booster circuit 1300.

The negative voltage generated by the booster circuit 1300 is input to the control buffer 1110 and the control buffer 1120. In addition, the negative voltage is input to a back gate of each of the switching elements SW41, SW42, and SW43.

The voltage comparison unit 1400 includes a level shifter 1410 and a comparator 1420. The negative voltage generated by the booster circuit 1300 is input to the level shifter 1410. The level shifter 1410 converts the negative voltage into a comparison voltage ranging from the ground voltage VSS to the power source voltage. The comparison voltage and a voltage VREF are input to the comparator 1420. The comparator 1420 outputs a control signal in accordance with a result of comparing the comparison voltage with the voltage VREF to the switching elements SW44 and SW45.

The states of the switching elements SW44 and SW45 are controlled based on the control signal output from the comparator 1420. When the comparison voltage has not reached a predetermined voltage, the switching element SW44 outputs the driving signal PCK41 to the driving buffer 1210 and the switching element SW45 outputs the driving signal PCK42 to the driving buffer 1220. When the comparison voltage has reached the predetermined voltage, the switching element SW44 stops the output of the driving signal PCK41 and the switching element SW45 stops the output of the driving signal PCK42. The booster circuit 1300 stops the generation of the lower negative voltage than the ground voltage VSS.

The power source voltage may be input to the switching element SW41. When the voltage of the driving signal PCK41 changes from the L voltage to the H voltage, a voltage generated by the pumping packet including the capacitance element C41 may increase. When the voltage of the driving signal PCK42 changes from the L voltage to the H voltage, a voltage generated by the pumping packet including the capacitance element C42 may increase. The booster circuit 1300 can generate a higher voltage than the power source voltage.

In general, the high voltage or the negative voltage needs to be provided to a control buffer unit in order to control a switching element (transistor) included in a booster circuit of a similar voltage generation circuit to the voltage generation circuit 1008. In the voltage generation circuit 1008 shown in FIG. 12, the negative voltage is input to the back gate of each of the switching elements SW41, SW42, and SW43. The control buffer unit 1100 needs to control each of the switching elements by using a control signal having the negative voltage in order to set the state of each of the switching elements to the OFF state.

SUMMARY OF THE INVENTION

According to a first aspect of the present invention, a voltage generation circuit includes a booster circuit including a capacitance element and a transistor, a control buffer circuit configured to control the transistor, and a driving buffer circuit configured to drive the capacitance element. The driving buffer circuit is configured to drive the capacitance element. A power source voltage or a ground voltage is input to the transistor. The power source voltage is a positive voltage. The ground voltage is a lower voltage than the power source voltage. The booster circuit is configured to generate a higher first voltage than the power source voltage or generate a lower second voltage than the ground voltage when the driving buffer circuit drives the capacitance element. The control buffer circuit is configured to control the transistor by using a third voltage that is lower than the first voltage and is higher than the ground voltage in a case in which the booster circuit generates the first voltage. The control buffer circuit is configured to control the transistor by using a fourth voltage that is higher than the second voltage and is lower than or equal to the ground voltage in a ease in which the booster circuit generates the second voltage.

According to a second aspect of the present invention, in the first aspect, the driving buffer circuit may be configured to drive the capacitance element by using a fifth voltage that is lower than the first voltage and is hither than the ground voltage in a case in which the booster circuit generates the first voltage. The driving buffer circuit may be configured to drive the capacitance element by using a sixth voltage that is higher than the second voltage and is lower than or equal to the ground voltage in a case in which the booster circuit generates the second voltage.

According to a third aspect of the present invention, in the first aspect, the control buffer circuit may include a bootstrap circuit. The control buffer circuit may be configured to generate a higher voltage than the third voltage and output the generated voltage to the transistor in a case in which the booster circuit generates the first voltage. The control buffer circuit may be configured to generate a lower voltage than the fourth voltage and output the generated voltage to the transistor in a case in which the booster circuit generates the second voltage.

According to a fourth aspect of the present invention, in the first aspect, the transistor may be configured as a strong-enhancement-type transistor.

According to a fifth aspect of the present invention, in the fourth aspect, a threshold value of the strong-enhancement-type transistor may be greater than or equal to −2 [V] and less than or equal to −1 [V] in a case in which the booster circuit generates the first voltage. A threshold value of the strong-enhancement-type transistor is greater than or equal to 1 [V] and less than or equal to 2 [V] in a case in which the booster circuit generates the second voltage.

According to a sixth aspect of the present invention, in the first aspect, the voltage generation circuit may further include a capacitance element configured to hold the first voltage or the second voltage.

According to a seventh aspect of the present invention, in the first aspect, the booster circuit may be a bootstrap-type booster circuit that includes, as the capacitance element, a first capacitance element and a second capacitance element and includes, as the transistor, a first transistor and a second transistor. The first capacitance element may include a first terminal into which a direct-current voltage is input and a second terminal. The second capacitance element may include a third terminal connected to the second terminal and a fourth terminal connected to the driving buffer circuit. The power source voltage or the ground voltage may be input to the second terminal and the third terminal via the first transistor. The second terminal and the third terminal may be connected to a third capacitance element via the second transistor.

According to an eighth aspect of the present invention, in the first aspect, the booster circuit may be a charge-pump-type booster circuit including one or more pumping packets. Each of the pumping packets may include the capacitance element and the transistor.

According to a ninth aspect of the present invention, an image sensor includes the voltage generation circuit and two or more pixels. The first voltage or the second voltage is input to the two or more pixels.

According to a tenth aspect of the present invention, a scope to be inserted into a living body includes the image sensor. The image sensor is disposed in a distal end of the scope.

According to an eleventh aspect of the present invention, a voltage generation method uses a booster circuit including a capacitance element and a transistor, a control buffer circuit configured to control the transistor, and a driving buffer circuit configured to drive the capacitance element. The voltage generation method includes a first step and a second step. The booster circuit generates a different first voltage from a power source voltage input to the transistor or generates a lower second voltage than a ground voltage input to the transistor in the first step when the driving huller circuit drives the capacitance element. The power source voltage is a positive voltage. The ground voltage is a lower voltage than the power source voltage. The control buffer circuit controls the transistor by using a third voltage that is different from the first voltage and is higher than the ground voltage in a case in which the booster circuit generates the first voltage. The control buffer circuit controls the transistor by using a fourth voltage that is higher than the second voltage and is lower than or equal to the ground voltage in a case in which the booster circuit generates the second voltage.

DETAILED DESCRIPTION OF THE INVENTION

Hereinafter, embodiments of the present invention will be described with reference to the drawings. In a case in which a first circuit element is connected to a second circuit element in the following descriptions, the first circuit element is directly connected to the second circuit element. Alternatively, a third circuit element different from the second circuit element is disposed between the first circuit element and the second circuit element, the first circuit element is connected to the third circuit element, and the third circuit element is connected to the second circuit element.

First Embodiment

Figure 1:
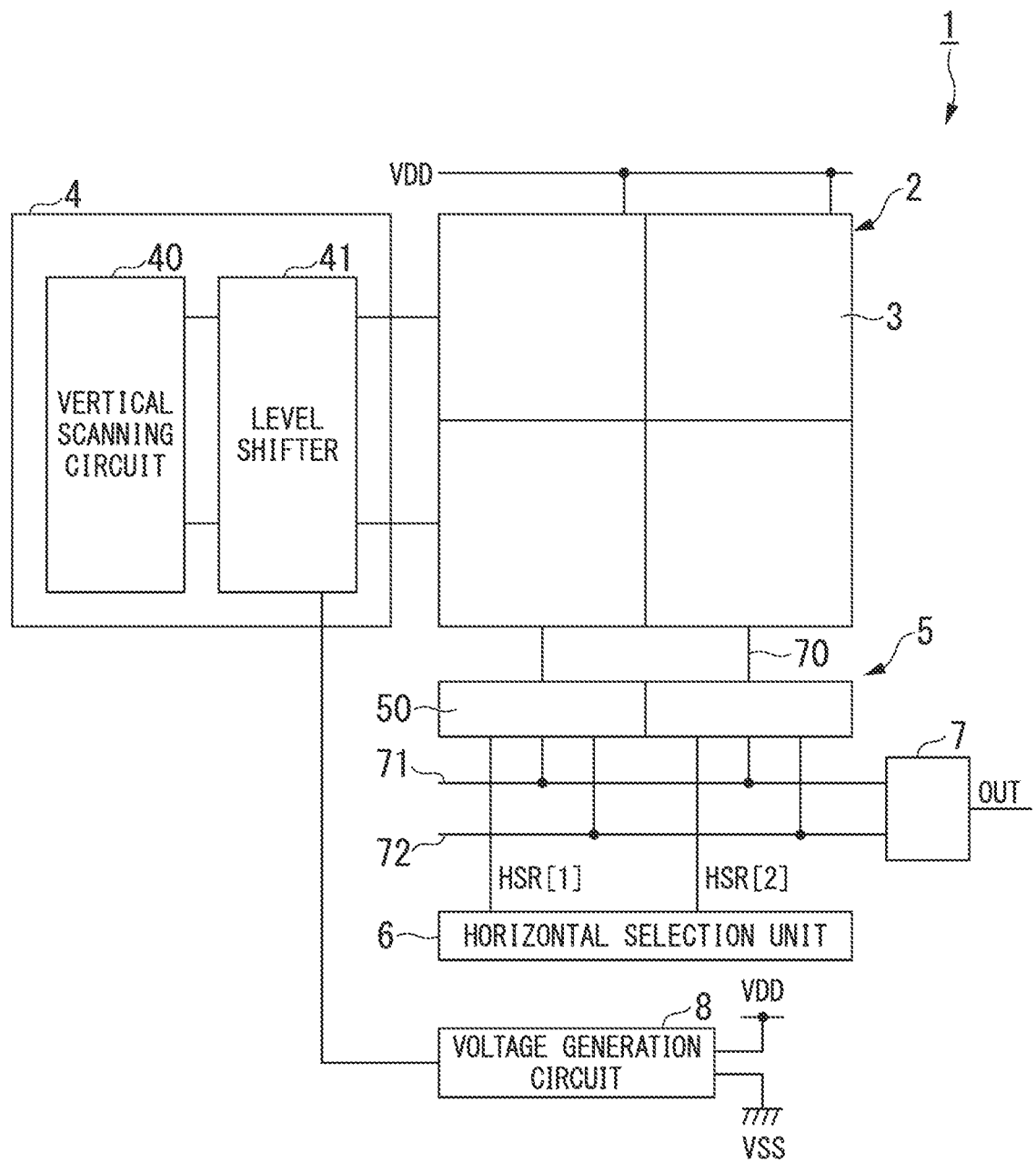
FIG. 1 is a block diagram showing a configuration of an imaging device according to a first embodiment of the present invention.

FIG. 1 shows a configuration of an imaging device 1 (image sensor) according to a first embodiment of the present invention. The imaging device 1 shown in FIG. 1 includes an imaging unit 2, a vertical selection unit 4, a column circuit unit 5, a horizontal selection unit 6, an output unit 7, and a voltage generation circuit 8.

The imaging unit 2 includes two or more pixels 3 disposed in a matrix shape. The two or more pixels 3 constitute an array having m rows and n columns. The number m and the number n are integers of two or more. The number of rows and the number of columns are not necessarily the same. In FIG. 1, an example in which the number of rows is two and the number of columns is three is shown. This is only an example and the present invention is not limited to this. The pixel 3 outputs a first pixel signal having a reset level and a second pixel signal having a signal level.

The vertical selection unit 4 selects the pixels 3 disposed in the row direction in the array of the two or more pixels 3. The vertical selection unit 4 controls an operation of the selected pixels 3. The vertical selection unit 4 outputs control signals used for controlling the two or more pixels 3 for each row in the array of the two or more pixels 3.

The column circuit unit 5 includes two or more column circuits 50. Each column circuit 50 is disposed for each column in the array of the two or inure pixels 3. Each column circuit 50 is connected to a vertical signal line 70 extending in the vertical direction, that is, the column direction. The vertical signal line 70 is disposed for each column in the array of the two or more pixels 3. The vertical signal line 70 is connected to the pixels 3 of each column. Each column circuit 50 is electrically connected to the pixels 3 via the vertical signal line 70. Each column circuit 50 generates a first pixel signal of the reset level output from the pixel 3 and generates a second pixel signal of the signal level output from the pixel 3.

Each column circuit 50 is connected to a first horizontal signal line 71 and a second horizontal signal line 72 extending in the horizontal direction, that is, the row direction. A selection pulse HSR[k] is output from the horizontal selection unit 6 to the column circuit 50 corresponding to a k-th column. The number k is one or two. The column circuit 50 selected based on the selection pulse HSR[k] Outputs the first pixel signal to the first horizontal signal line 71 and outputs the second pixel signal to the second horizontal signal line 72.

One column circuit 50 may be disposed for two or more columns in the array of the two or more pixels 3 and may be used in the two or more columns in a time-division manner. Accordingly, the column circuit 50 has only to be disposed so as to correspond to one or more columns in the array of the two or more pixels 3.

The first horizontal signal line 71 and the second horizontal signal line 72 are connected to the output unit 7. The horizontal selection unit 6 sequentially selects the column circuits 50 by sequentially outputting the selection pulse HSR[1] and the selection pulse HSR[2] to the column circuits 50. The first pixel signal and the second pixel signal output from the column circuit 50 selected by the horizontal selection unit 6 are transferred to the output unit 7.

The output unit 7 generates an output signal OUT based on the first pixel signal and the second pixel signal. For example, the output signal OUT is the difference between the first pixel signal and the second pixel signal. The output unit 7 outputs the output signal OUT to a subsequent-stage circuit.

A power source voltage VDD and a ground voltage VSS are input to the voltage generation circuit 8. The power source voltage VDD and the ground voltage VSS are direct-current (DC) voltages. The power source voltage VDD is a higher positive voltage than 0 [V]. The ground voltage VSS is 0 [V] or a lower positive voltage than the power source voltage VDD. The voltage generation circuit 8 generates a positive voltage having a greater absolute value than that of the power source voltage VDD by using the power source voltage VDD and the ground voltage VSS. The voltage generation circuit 8 outputs the generated positive voltage to the vertical selection unit 4.

The vertical selection unit 4 includes a vertical scanning circuit 40 and a level shifter 41. The vertical scanning circuit 40 outputs a control signal used for controlling the two or more pixels 3. The control signal includes a reset control signal, a transfer control signal, and a selection control signal. Each of the control signals has a high (H) voltage or a low (L) voltage. The H voltage is the power source voltage VDD, and the L voltage is the ground voltage VSS. The level shifter 41 converts the H voltage of the reset control signal output from the vertical scanning circuit 40 into the same voltage as the positive voltage output from the voltage generation circuit 8. The reset control signal having an H voltage (positive voltage) or an L voltage (ground voltage VSS) is input to the two or more pixels 3. In addition, the transfer control signal and the selection control signal, each of which has an H voltage (power source voltage VDD) or an L voltage (ground voltage VSS), are input to the two or more pixels 3.

Figure 2:
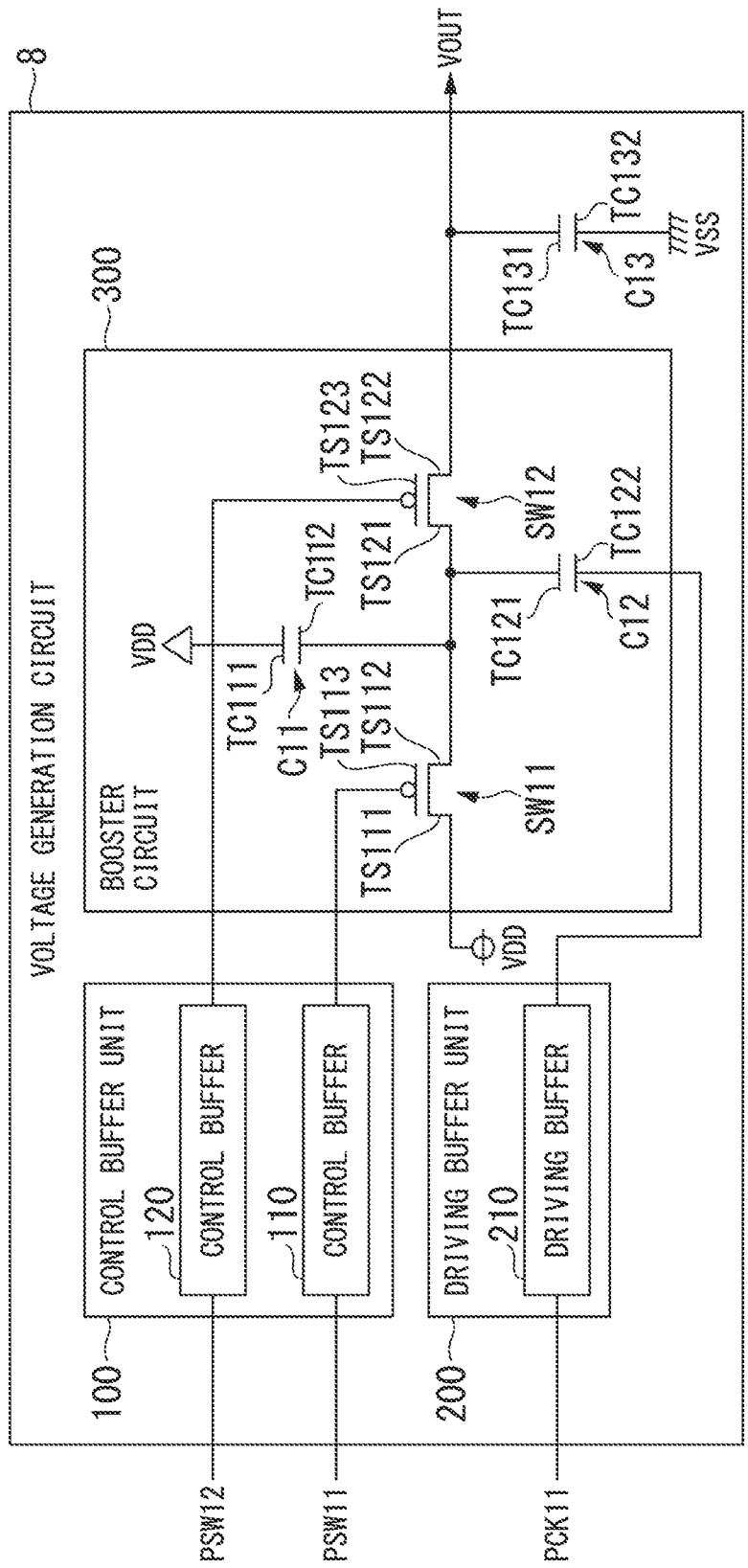
FIG. 2 is a circuit diagram showing a configuration of a voltage generation circuit in the imaging device according to the first embodiment of the present invention.

FIG. 2 shows a configuration of the voltage generation circuit 8. The voltage generation circuit 8 shown in FIG. 2 includes a control buffer unit 100, a driving buffer unit 200, a booster circuit 300, and a capacitance element C13.

The control buffer unit 100 includes a control buffer 110 and a control buffer 120. The driving buffer unit 200 includes a driving buffer 210. The booster circuit 300 includes a switching element SW11, a switching element SW12, a capacitance element C11, and a capacitance element C12. The booster circuit 300 constitutes a bootstrap-type booster circuit.

A schematic configuration of the voltage generation circuit 8 will be described. The control buffer unit 100 (control buffer circuit) controls the switching elements SW11 and SW12 (transistors). The driving buffer unit 200 (driving buffer circuit) drives the capacitance elements C11 and C12. The power source voltage VDD is input to the switching element SW11. When the driving buffer unit 200 drives the capacitance elements C11 and C12, the booster circuit 300 generates a higher positive voltage (first voltage) than the power source voltage VDD. The control buffer unit 100 controls the switching elements SW11 and SW12 by using a voltage (third voltage) that is lower than the positive voltage and is higher than the ground voltage VSS.

The configuration of the voltage generation circuit 8 will be described in detail. The power source voltage VDD and the ground voltage VSS are input to the control buffer 110 and the control buffer 120. The control buffer 110 outputs a control signal PSW11 having an H voltage or an L voltage to the booster circuit 300. The control buffer 120 outputs a control signal PSW12 having an H voltage or an L voltage to the booster circuit 300. The H voltage of each of the control signals is the power source voltage VDD (third voltage), and the L voltage of each of the control signals is the ground voltage VSS.

The power source voltage VDD and the ground voltage VSS are input to the driving buffer 210. The driving buffer 210 outputs a driving signal PCK11 having an H voltage or an L voltage to the booster circuit 300. The H voltage of the driving signal PCK11 is the power source voltage VDD (fifth voltage), and the L voltage of the driving signal PCK11 is the ground voltage VSS.

Each of the switching elements SW11 and SW12 is a PMOS transistor and includes a first terminal, a second terminal, and a gate terminal. One of the first and second terminals is a source terminal, and the other of the first and second terminals is a drain terminal. The switching element SW11 includes a first terminal TS111, a second terminal TS112, and a gate terminal TS113. The switching element SW12 includes a first terminal TS121, a second terminal TS122, and a gate terminal TS123.

The power source voltage VDD is input to the first terminal TS111 of the switching element SW11. The control signal PSW11 is input to the gate terminal TS113 of the switching element SW11. The first terminal TS121 of the switching element SW12 is connected to the second terminal TS112 of the switching element SW11. The control signal PSW12 is input to the gate terminal TS123 of the switching element SW12.

The capacitance element C11 includes a first terminal TC111 and a second terminal TC112. The capacitance element C12 includes a first terminal TC121 and a second terminal TC122. The power source voltage VDD is input to the first terminal TC111 of the capacitance element C11. The first terminal TC121 of the capacitance element C12 is connected to the second terminal TC112 of the capacitance element C11. The second terminal TC112 of the capacitance element C11 and the first terminal TC121 of the capacitance element C12 are connected to the second terminal TS112 of the switching element SW11 and the first terminal TS121 of the switching element SW12. The driving signal PCK11 is input to the second terminal TC122 of the capacitance element C12.

The state of each of the switching elements SW11 and SW12 becomes any one of an ON state and an OFF state. The state of the switching element SW11 is controlled based on the control signal PSW11. The state of the switching element SW12 is controlled based on the control signal PSW12. When the voltage of each of the control signals is the L voltage, the state of each of the switching elements is the ON state. When the voltage of each of the control signals is the H voltage, the state of each of the switching elements is the OFF state.

For example, each of the switching elements SW11 and SW12 is an enhancement-type PMOS transistor having a negative threshold voltage. The threshold voltage of the enhancement-type PMOS transistor ranges from −0.8 [V] to −0.7 [V]. Each of the switching elements SW11 and SW12 may be a strong-enhancement-type PMOS transistor. The threshold voltage of the strong-enhancement-type PMOS transistor is greater than or equal to −2 [V] and less than or equal to −1 [V].

The capacitance element C12 is driven based on the driving signal PCK11. The voltage at the first terminal TC121 of the capacitance element C12 changes in accordance with a change of the voltage of the driving signal PCK11. The booster circuit 300 generates a higher positive voltage (first voltage) than the power source voltage VDD. The driving buffer unit 200 drives the capacitance element C12 by using the power source voltage VDD (fifth voltage). The voltage used for driving the capacitance element C12 is lower than the positive voltage generated by the booster circuit 300 and is higher than the ground voltage VSS.

The capacitance element C13 includes a first terminal TC131 and a second terminal TC132. The first terminal TC131 of the capacitance element C13 is connected to the second terminal TS122 of the switching element SW12. The ground voltage VSS is input to the second terminal TC132 of the capacitance element C13. The capacitance element C13 holds the positive voltage (first voltage) generated by the booster circuit 300 and outputs the positive voltage as an output voltage VOUT.

The control buffer unit 100 outputs the control signal PSW11 having either the power source voltage VDD or the ground voltage VSS to the gate terminal TS113 of the switching element SW11. In addition, the control buffer unit 100 outputs the control signal PSW12 having either the power source voltage VDD or the ground voltage VSS to the gate terminal TS123 of the switching element SW12. The positive voltage generated by the booster circuit 300 is not input to the control buffer unit 100. Since the switching elements SW11 and SW12 have the negative threshold voltage, the control buffer unit 100 can set the switching elements SW11 and SW12 to be in the OFF state by using the power source voltage VDD without using a higher positive voltage than the power source voltage VDD. The positive voltage generated by the booster circuit 300 may be input to a back gate of each of the switching elements SW11 and SW12.

As described above, the booster circuit 300 is a bootstrap-type booster circuit including the capacitance element C11 (first capacitance element), the capacitance element C12 (second capacitance element), the switching element SW11 (first transistor), and the switching element SW12 (second transistor). The capacitance element C11 includes the first terminal TC111 to which a DC voltage (power source voltage VDD) is input and the second terminal TC112. The capacitance element C12 includes both the first terminal TC121 (third terminal) connected to the second terminal TC112 and the second terminal TC122 (fourth terminal) connected to the driving buffer unit 200 (driving buffer circuit). The power source voltage VDD is input to the second terminal TC112 of the capacitance element C11 and the first terminal TC121 of the capacitance element C12 via the switching element SW11. The second terminal TC112 of the capacitance element C11 and the first terminal TC121 of the capacitance element C12 are connected to the capacitance element C13 (third capacitance element) via the switching element SW12.

In a case in which each of the capacitance elements C11 and C12 has a relatively large capacitance value causing a load capacitor at the output terminal of the voltage generation circuit 8 to be neglected, the capacitance element C13 may be omitted. In a case in which the load capacitor at the output terminal of the voltage generation circuit 8 has a large capacitance value, the load capacitor may be used as the capacitance element C13.

Figure 3:
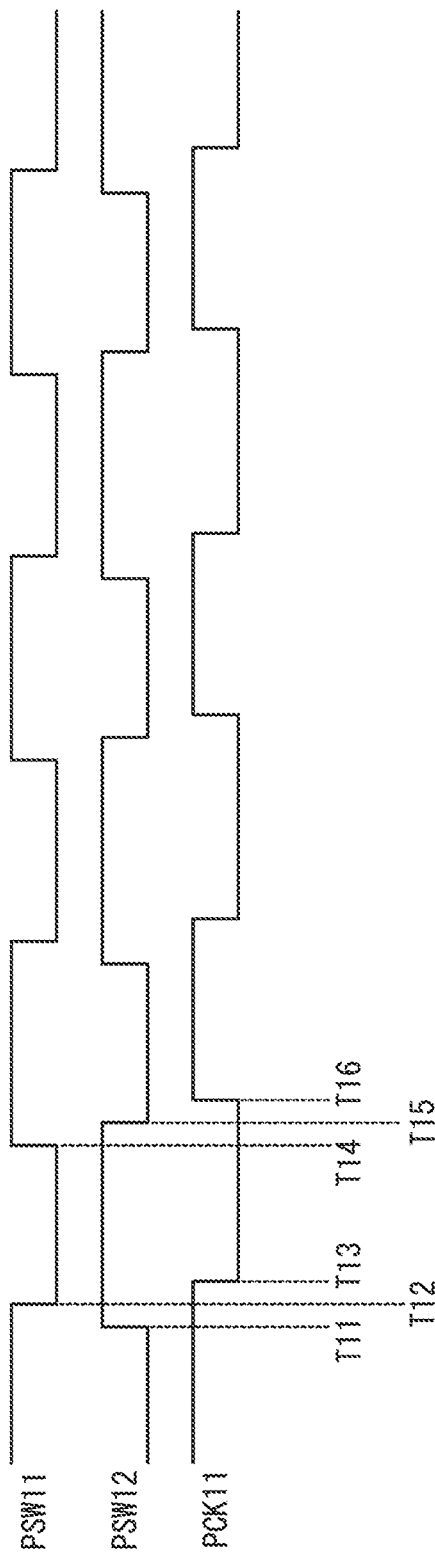
FIG. 3 is a timing chart showing an operation of the voltage generation circuit in the imaging device according to the first embodiment of the present invention.

An operation of the voltage generation circuit 8 will be described by using FIG. 3. FIG. 3 shows waveforms of the control signal PSW11, the control signal PSW12, and the driving signal PCK11. The horizontal direction in FIG. 3 indicates time and the vertical direction in FIG. 3 indicates a voltage.

The voltage of the control signal PSW12 is set to the H voltage at a time point T11, and the state of the switching element SW12 is set to the OFF state. The voltage of the control signal PSW11 is set to the L voltage at a time point T12 after the time point T11, and the state of the switching element SW11 is set to the ON state. At this time, the power source voltage VDD is input to the first terminal TC121 of the capacitance element C12 via the switching element SW11. The voltage of the driving signal PCK11 is set to the L voltage at a time point T13 after the time point T12, and the ground voltage VSS is input to the second terminal TC122 of the capacitance element C12.

The voltage of the control signal PSW11 is set to the H voltage at a time point T14 after the time point T13, and the state of the switching element SW11 is set to the OFF state. The voltage of the control signal PSW12 is set to the L voltage at a time point T15 after the time point T14, and the state of the switching element SW12 is set to the ON state.

The voltage of the driving signal PCK11 is set to the H voltage at a time point T16 after the time point T15, and the power source voltage VDD is input to the second terminal TC122 of the capacitance element C12. When the voltage of the driving signal PCK11 changes from the L voltage to the H voltage, the voltage at the first terminal TC121 of the capacitance element C12 increases. The higher positive voltage (first voltage) than the power source voltage VDD is generated at the first terminal TC121 of the capacitance element C12.

In the example shown in FIG. 3, after the state of the switching element SW12 is set to the ON state at the time point T15, the power source voltage VDD is input to the second terminal TC122 of the capacitance element C12 at the time point T16. The state of the switching element SW12 may be set to the ON state after the power source voltage VDD is input to the second terminal TC122 of the capacitance element C12.

The following Expression (1) shows a value Vddh of the positive voltage generated at the first terminal TC121 of the capacitance element C12. A voltage value Vdd in Expression (1) indicates the value of the power source voltage VDD, and a voltage value Vss in Expression (1) indicates the value of the ground voltage VSS. A capacitance value C1 in Expression (1) indicates the capacitance value of the capacitance element C11, and a capacitance value C2 in Expression (1) indicates the capacitance value of the capacitance element C12.

[Math. 1]

$$Vddh = \frac{C1}{C1+C2} \times (Vdd - Vss) + Vdd \quad (1)$$

For example, the capacitance value C1 is 0.5 [pF], and the capacitance value C2 is 2.8 [pF]. For example, the voltage value Vdd is 3.3 [V], and the voltage value Vss is 0 [V]. In this example, the value Vddh of the positive voltage is 3.8 [V].

In the above-described example, the L voltage of the driving signal PCK11 is the ground voltage VSS, and the H voltage of the driving signal PCK11 is the power source voltage VDD. The voltage of the driving signal PCK11 is not limited to this example.

A charge carrier (electron/hole) in accordance with the positive voltage generated at the first terminal TC121 of the capacitance element C12 is transferred to the first terminal TC131 of the capacitance element C13. The booster circuit 300 repeats the above-described operation. Therefore, the voltage at the first terminal TC131 of the capacitance element C13 approaches the positive voltage generated at the first terminal TC121 of the capacitance element C12.

The following Expression (2) shows a value Vout of the output voltage VOUT after the positive voltage generated at the first terminal TC121 of the capacitance element C12 is transferred to the first terminal TC131 of the capacitance element C13 n times. A voltage value Vdd in Expression (2) indicates the value of the power source voltage VDD, and a voltage value Vddh in Expression (2) indicates the value of the positive voltage. A capacitance value C1 in Expression (2) indicates the capacitance value of the capacitance element C11, a capacitance value C2 in Expression (2) indicates the capacitance value of the capacitance element C12, and a capacitance value C3 in Expression (2) indicates the capacitance value of the capacitance element C13. When the number n is infinite, the value Vout of the output voltage VOUT converges to the voltage value Vddh.

[Math. 2]

$$Vout = Vdd + (Vddh - Vdd) \times \left[1 - \left\{\frac{(C1+C2)C3}{C1C2+C2C3+C3C1}\right\}^n\right] \quad (2)$$

A voltage generation method shown in FIG. 3 includes a first step (time point T16) and a second step (time points T11 and T14). When the driving buffer unit 200 drives the capacitance element C12, the booster circuit 300 generates a higher positive voltage (first voltage) than the power source voltage VDU input to the switching element SW11 in the first step. The control buffer unit 100 controls the switching elements SW11 and SW12 by using a voltage (third voltage) that is lower than the positive voltage and is higher than the ground voltage VSS in the second step.

Figure 4:
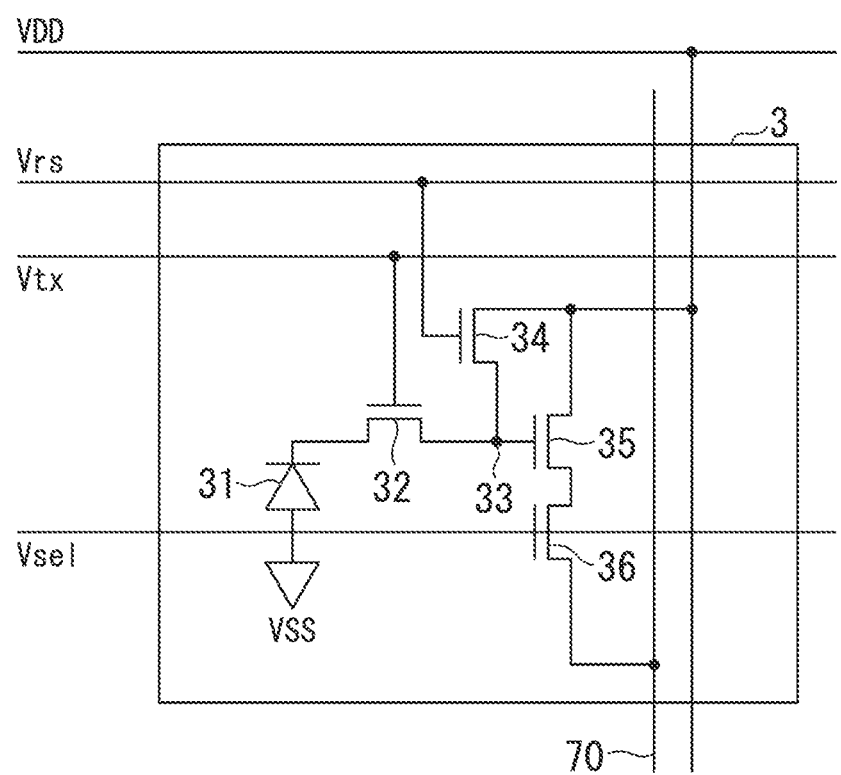
FIG. 4 is a circuit diagram showing a configuration of a pixel in the imaging device according to the first embodiment of the present invention.

FIG. 4 shows a configuration of the pixel 3. The pixel 3 shown in FIG. 4 includes a photoelectric conversion unit 31, a transfer transistor 32, a charge storage portion 33, a reset transistor 34, an amplification transistor 35, and a selection transistor 36.

The photoelectric conversion unit 31 is a photodiode. The photoelectric conversion unit 31 generates an electric charge that is based on the amount of incident light. The transfer transistor 32 transfers the electric charge generated by the photoelectric conversion unit 31 to the charge storage portion 33. The charge storage portion 33 is a floating diffusion. The charge storage portion 33 stores the electric charge transferred by the transfer transistor 32. The reset transistor 34 resets the voltage of the charge storage portion 33 to a voltage in accordance with the power source voltage VDD. The amplification transistor 35 generates a pixel signal by amplifying a signal that is based on the voltage of the charge storage portion 33. The selection transistor 36 outputs the pixel signal to the vertical signal line 70. The first pixel signal having the reset level and the second pixel signal having the signal level are output from the pixel 3.

The control signal output from the vertical scanning circuit 40 includes a reset control signal Vrs, a transfer control signal Vtx, and a selection control signal Vsel. The level shifter 41 converts the H voltage of the reset control signal Vrs output from the vertical scanning circuit 40 into the same voltage as the positive voltage output from the voltage generation circuit 8. The reset control signal Vrs is provided to the reset transistor 34. The transfer control signal Vtx is provided to the transfer transistor 32. The selection control signal Vsel is provided to the selection transistor 36.

In the first embodiment, the voltage generation circuit 8 sets the switching elements SW11 and SW12 to be in the ON state by using the ground voltage VSS. In addition, the voltage generation circuit 8 sets the switching elements SW11 and SW12 to be in the OFF state by using the power source voltage VDD without using the positive voltage generated by the booster circuit 300. Therefore, the voltage generation circuit 8 can generate a necessary voltage for the operation of the imaging device 1 without increasing, the circuit scale.

The positive voltage generated by the booster circuit 300 does not need to be provided to the control buffer unit 100. Since the capacitance element C13 is miniaturized, the miniaturization of the imaging device 1 is realized.

The booster circuit 300 is configured as a bootstrap-type booster circuit. In the first embodiment, the miniaturization of the voltage generation circuit 8 is easily realized.

First Modified Example of First Embodiment

Figure 5:
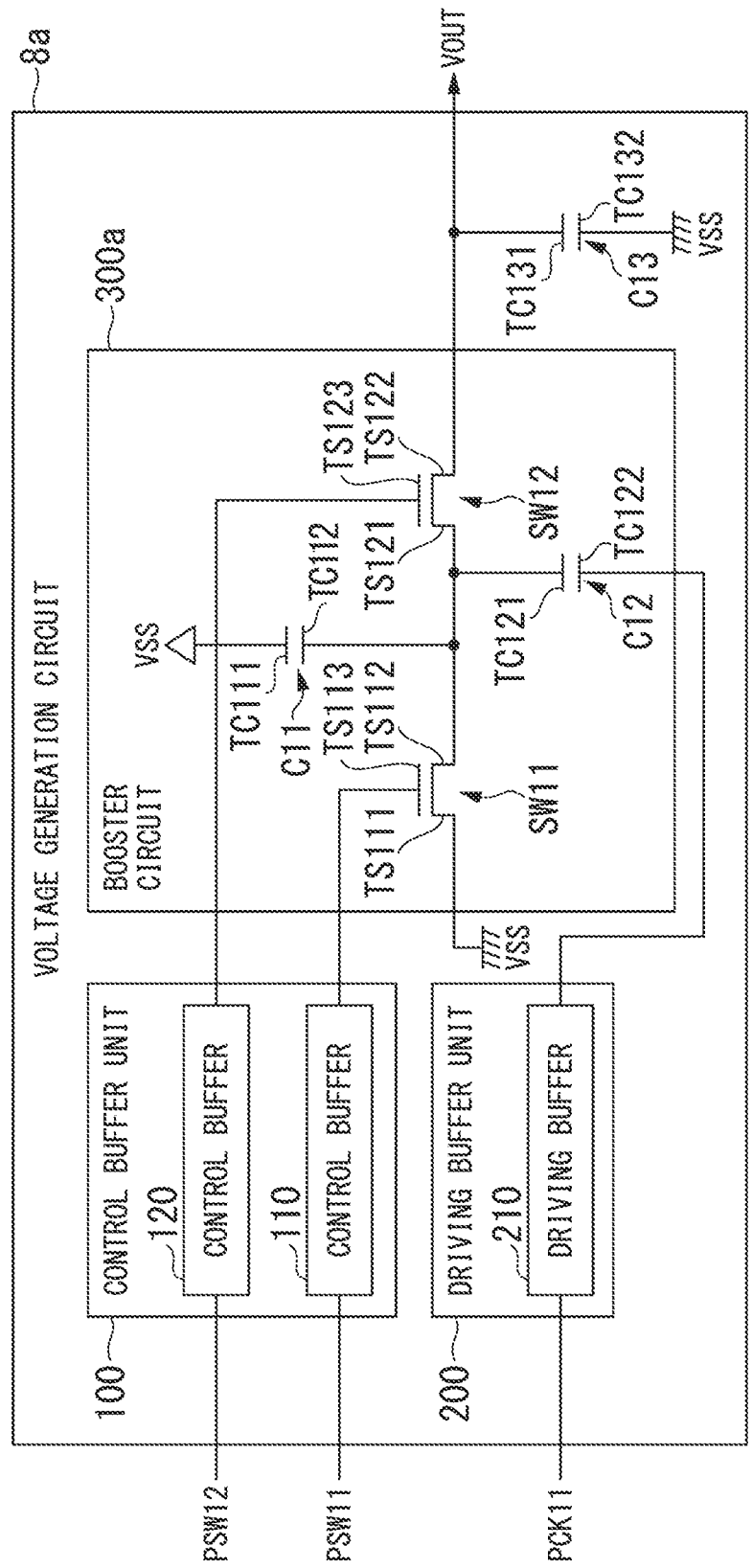
FIG. 5 is a block diagram showing a configuration of a voltage generation circuit in an imaging device according to a first modified example of the first embodiment of the present invention.

A first modified example of the first embodiment of the present invention will be described. In the imaging device 1 according to the first modified example of the first embodiment, the voltage generation circuit 8 shown in FIG. 2 is changed to a voltage generation circuit 8a shown in FIG. 5. FIG. 5 shows a configuration of the voltage generation circuit 8a. The voltage generation circuit 8a shown in FIG. 5 includes a control buffer unit 100, a driving buffer unit 200, a booster circuit 300a, and a capacitance element C13. Descriptions of the same configuration as that shown in FIG. 2 will be omitted.

The control buffer unit 100 includes a control buffer 110 and a control buffer 120. The driving buffer unit 200 includes a driving buffer 210. The booster circuit 300a includes a switching element SW11, a switching element SW12, a capacitance element C11, and a capacitance element C12. The booster circuit 300a constitutes a bootstrap-type booster circuit.

A schematic configuration of the voltage generation circuit 8a will be described. The control buffer unit 100 (control buffer circuit) controls the switching elements SW11 and SW12 (transistors). The driving buffer unit 200 (driving buffer circuit) drives the capacitance elements C11 and C12. The ground voltage VSS is input to the switching element SW11. When the driving huller unit 200 drives the capacitance elements C11 and C12, the booster circuit 300a generates a lower negative voltage (second voltage) than the ground voltage VSS. The control buffer unit 100 controls the switching elements SW11 and SW12 by using a voltage (fourth voltage) that is higher than the negative voltage and is lower than the ground voltage VSS.

The voltage generation circuit 8*a* generates a negative voltage having a greater absolute value than that of the ground voltage VSS by using the power source voltage VDD and the ground voltage VSS. The voltage generation circuit 8*a* outputs the generated negative voltage to the vertical selection unit 4.

The vertical scanning circuit 40 outputs a control signal including a reset control signal, a transfer control signal, and a selection control signal. The level shifter 41 converts the L voltage of the transfer control signal output from the vertical scanning circuit 40 into the same voltage as the negative voltage output from the voltage generation circuit 8*a*. The transfer control signal having an H voltage (lower source voltage VDD) or an L voltage (negative voltage) is input to the two or more pixels 3. In addition, the reset control signal and the selection control signal, each of which has an Ft voltage (power source voltage VDD) or an L voltage (ground voltage VSS), are input to the two or more pixels 3.

The configuration of the voltage generation circuit 8*a* will be described in detail. The control buffer 110 outputs a control signal PSW11 having an H voltage or an voltage to the booster circuit 300*a*. The control buffer 120 outputs a control signal PSW12 having an H voltage or an L voltage to the booster circuit 300*a*. The H voltage of each of the control signals is the power source voltage VDD, and the L voltage of each of the control signals is the ground voltage VSS (fourth voltage).

The driving buffer 210 outputs a driving signal PCK11 having an H voltage or an L voltage to the booster circuit 300*a*. The H voltage of the driving signal PCK11 is the power source voltage VDU, and the L voltage of the driving signal PCK11 is the ground voltage VSS (sixth voltage).

Each of the switching elements SW11 and SW12 is an NMOS transistor. Terminals included in each of the switching elements are the sane as those included in each of the switching elements shown in FIG. 2. The ground voltage VSS is input to the first terminal TS111 of the switching element SW11. Terminals included in each of the capacitance elements are the same as those included in each of the capacitance elements shown in FIG. 2.

When the voltage of each of the control signals is the H voltage, the state of each of the switching elements is the ON state. When the voltage of each of the control signals is the L voltage, the state of each of the switching elements is the OFF state.

For example, each of the switching elements SW11 and SW12 is an enhancement-type NMOS transistor having a positive threshold voltage. The threshold voltage of the enhancement-type NMOS transistor ranges from 0.7 [V] to 0.8 [V]. Each of the switching elements SW11 and SW12 may be a strong-enhancement-type NMOS transistor. The threshold voltage of the strong-enhancement-type NMOS transistor is greater than or equal to 1 [V] and less than or equal to 2 [V].

The capacitance element C12 is driven based on the driving signal PCK11. The voltage at the first terminal TC121 of the capacitance element C12 changes in accordance with a change of the voltage of the driving signal PCK11. The booster circuit 300*a* generates a lower negative voltage (second voltage) than the ground voltage VSS. The driving buffer unit 200 drives the capacitance element C12 by using the ground voltage VSS (sixth voltage). The voltage used for driving the capacitance element C12 is higher than the negative voltage generated by the booster circuit 300*a* and is lower than or equal to the ground voltage VSS.

The capacitance element C13 holds the negative voltage (second voltage) generated by the booster circuit 300*a* and outputs the negative voltage as an output voltage VOUT.

The control buffer unit 100 outputs the control signal PSW11 having either the power source voltage VDD or the ground voltage VSS to the gate terminal TS113 of the switching element SW11. In addition, the control buffer unit 100 outputs the control signal PSW12 having either the power source voltage VDD or the ground voltage VSS to the gate terminal TS123 of the switching element SW12. The negative voltage generated by the booster circuit 300*a* is not input to the control buffer unit 100. Since the switching elements SW11 and SW12 have the positive threshold voltage, the control buffer unit 100 can set the switching elements SW11 and SW12 to be in the OFF state by using the ground voltage VSS without using a lower negative voltage than the ground voltage VSS. The negative voltage generated by the booster circuit 300*a* may be input to a back gate of each of the switching elements SW11 and SW12.

As described above, the booster circuit 300*a* is a bootstrap-type booster circuit including the capacitance element C11 (first capacitance element), the capacitance element C12 (second capacitance element), the switching element SW11 (first transistor), and the switching element SW12 (second transistor). The capacitance element C11 includes the first terminal TC111 to which a DC voltage (ground voltage VSS) is input and the second terminal TC112. The capacitance element C12 includes both the first terminal TC121 (third terminal) connected to the second terminal TC112 and the second terminal TC122 (fourth terminal) connected to the driving buffer unit 200 (driving huller circuit). The ground voltage VSS is input to the second terminal TC112 of the capacitance element C11 and the first terminal TC121 of the capacitance element C12 via the switching element SW11. The second terminal TC112 of the capacitance element C11 and the first terminal TC121 of the capacitance element C12 are connected to the capacitance element C13 (third capacitance element) via the switching element SW12.

Figure 6:
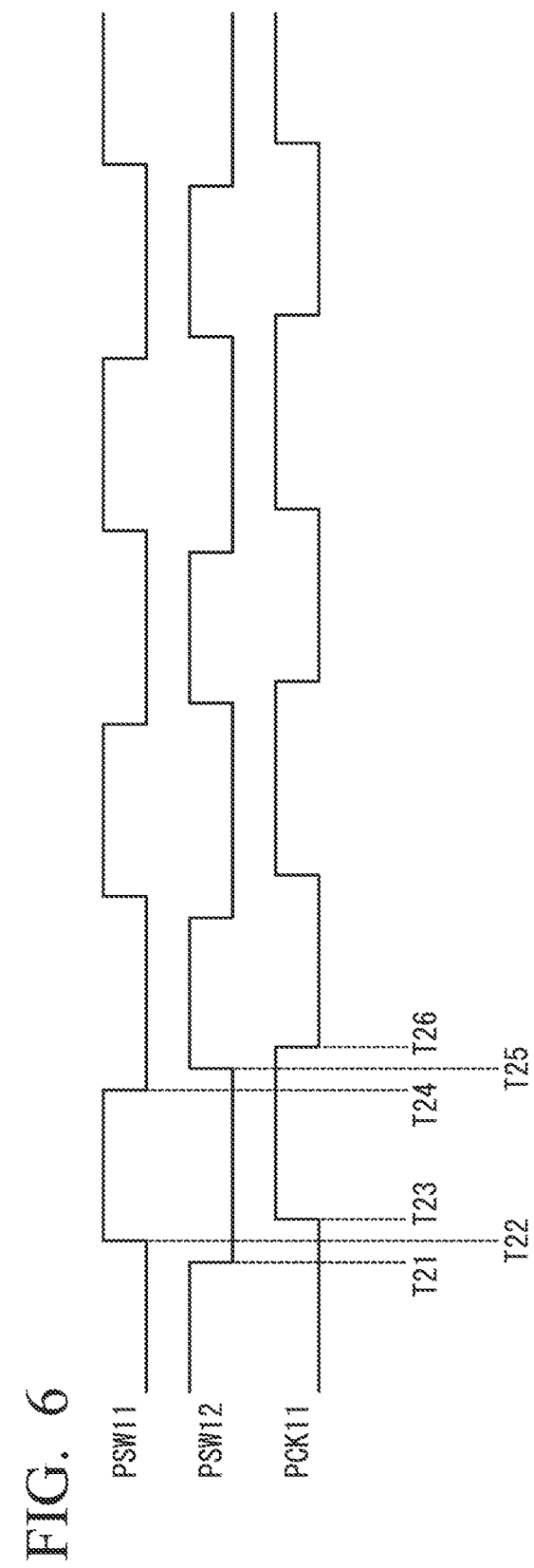
FIG. 6 is a timing chart showing an operation of the voltage generation circuit in the imaging device according to the first modified example of the first embodiment of the present invention.

An operation of the voltage generation circuit 8*a* will be described by using FIG. 6. FIG. 6 shows waveforms of the control signal PSW11, the control signal PSW12, and the driving signal PCK11. The horizontal direction in FIG. 6 indicates time, and the vertical direction in FIG. 6 indicates a voltage.

The voltage of the control signal PSW12 is set to the L voltage at a time point T21, and the state of the switching element SW12 is set to the OFF state. The voltage of the control signal PSW11 is set to the H voltage at a time point T22 after the time point T21, and the state of the switching element SW11 is set to the ON state. At this time, the ground voltage VSS is input to the first terminal TC121 of the capacitance element C12 via the switching element SW11. The voltage of the driving signal PCK11 is set to the H voltage at a time point T23 after the time point T22, and the power source voltage VDD is input to the second terminal TC122 of the capacitance element C12.

The voltage of the control signal PSW11 is set to the L voltage at a time point T24 after the time point T23, and the state of the switching element SW11 is set to the OFF state. The voltage of the control signal PSW12 is set to the H voltage at a time point T25 after the time point 124, and the state of the switching element SW12 is set to the ON state.

The voltage of the driving signal PCK11 is set to the L voltage at a time point 126 after the time point T25, and the ground voltage VSS is input to the second terminal TC122 of the capacitance element C12. When the voltage of the driving signal PCK11 changes from the H voltage to the L voltage, the voltage at the first terminal TC121 of the capacitance element C12 decreases. The lower negative voltage (second voltage) than the aground voltage VSS is generated at the first terminal TC121 of the capacitance element C12.

In the example shown in FIG. 6, after the state of the switching element SW12 is set to the ON state at the time point T25, the ground voltage VSS is input to the second terminal TC122 of the capacitance element C12 at the time point T26. The state of the switching element SW12 may be set to the ON state after the ground voltage VSS is input to the second terminal TC122 of the capacitance element C12.

The following Expression (3) shows a value Vssl of the negative voltage generated at the first terminal TC121 of the capacitance element C12. A voltage value Vdd in Expression (3) indicates the value of the power source voltage VDD, and a voltage value Vss in Expression (3) indicates the value of the ground voltage VSS. A capacitance value C1 in Expression (3) indicates the capacitance value of the capacitance element C11, and a capacitance value C2 in Expression (3) indicates the capacitance value of the capacitance element C12.

[Math. 3]

$$Vssl = \frac{C1}{C1+C2} \times (Vss - Vdd) + Vss \qquad (3)$$

For example, the capacitance value C1 is 1.0 [pF], and the capacitance value C2 is 2.3 [pF]. For example, the voltage value Vdd is 3.3 [V], and the voltage value Vss is 0 [V]. In this example, the value Vssl of the negative voltage is −1.0 [V].

In the above-described example, the L voltage of the driving signal PCK11 is the ground voltage VSS, and the H voltage of the driving signal PCK11 is the power source voltage VDD. The voltage of the driving signal PCK11 is not limited to this example.

A charge carrier (electron/hole) in accordance with the negative voltage generated at the first terminal TC121 of the capacitance element C12 is transferred to the first terminal TC131 of the capacitance element C13. The booster circuit 300a repeats the above-described operation. Therefore, the voltage at the first terminal TC131 of the capacitance element C13 approaches the negative voltage generated at the first terminal TC121 of the capacitance element C12.

The following Expression (4) shows a value Vout of the output voltage VOUT after the negative voltage generated at the first terminal TC121 of the capacitance element C12 is transferred to the first terminal TC131 of the capacitance element C13 n times. A voltage value Vss in Expression (4) indicates the value of the ground voltage VSS, and a voltage value Vssl in Expression (4) indicates the value of the negative voltage. A capacitance value C1 in Expression (4) indicates the capacitance value of the capacitance element C11, a capacitance value C2 in Expression (4) indicates the capacitance value of the capacitance element C12, and a capacitance value C3 in Expression (4) indicates the capacitance value of the capacitance element C13. When the number n is infinite, the value Vout of the output voltage VOLT converges to the voltage value Vssl.

[Math. 4]

$$Vout = Vss + (Vssl - Vss) \times \left[1 - \left\{\frac{(C1+C2)C3}{C1C2+C2C3+C3C1}\right\}^n\right] \qquad (4)$$

A voltage generation method shown in FIG. 6 include a first step (time point T26) and a second step (time points T21 and T24). When the driving buffer unit 200 drives the capacitance element C12, the booster circuit 300a generates a lower negative voltage (second voltage) than the ground voltage VSS input to the switching element SW11 in the first step. The control buffer unit 100 controls the switching elements SW11 and SW12 by using a voltage (fourth voltage) that is higher than the negative voltage and is lower than or equal to the ground voltage VSS in the second step.

In the first modified example of the first embodiment, the voltage generation circuit 8a sets the switching elements SW11 and SW12 to be in the ON stale by using the power source voltage VDD. In addition, the voltage generation circuit 8a sets the switching elements SW11 and SW12 to be in the OFF state by using the ground voltage VSS without using the negative voltage generated by the booster circuit 300a. Therefore, the voltage generation circuit 8a can generate a necessary voltage for the operation of the imaging device 1 without increasing the circuit scale.

The negative voltage generated by the booster circuit 300a does not need to be provided to the control buffer unit 100. Since the capacitance element C13 is miniaturized, the miniaturization of the imaging device 1 is realized.

The booster circuit 300a is configured as a bootstrap-type booster circuit. In the first modified example of the first embodiment, the miniaturization of the voltage generation circuit 8a is easily realized.

Second Modified Example of First Embodiment

A second modified example of the first embodiment of the present invention will be described by using the voltage generation circuit 8 shown in FIG. 2. In the second modified example of the first embodiment, the voltage generation circuit 8 generates a positive voltage having a smaller absolute value than that of the power source voltage VDD by using the power source voltage VDD and the ground voltage VSS.

Figure 7:
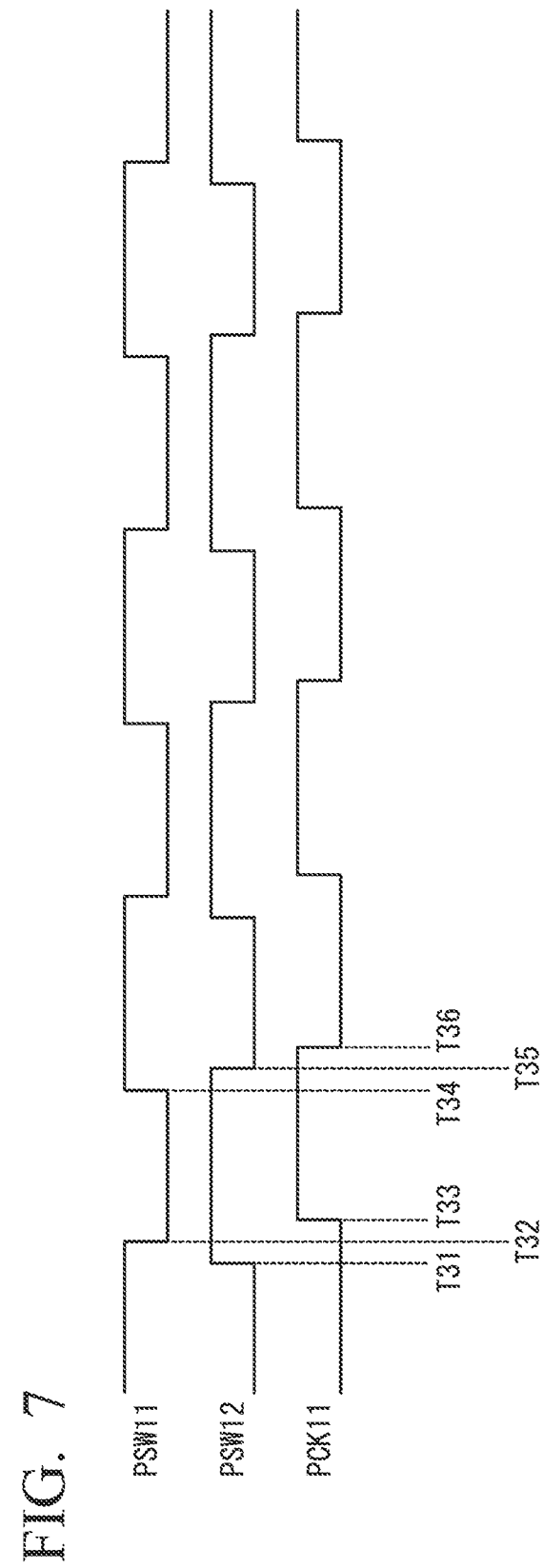
FIG. 7 is a timing chart showing an operation of a voltage generation circuit in an imaging device according to a second modified example of the first embodiment of the present invention.

An operation of the voltage generation circuit 8 will be described by using FIG. 7. FIG. 7 shows waveforms of the control signal PSW11, the control signal PSW12, and the driving signal PCK11. The horizontal direction in FIG. 7 indicates time, and the vertical direction in FIG. 7 indicates a voltage.

The voltage of the control signal PSW12 is set to the H voltage at a time point T31, and the state of the switching element SW12 is set to the OFF state. The voltage of the control signal PSW11 is set to the L voltage at a time point T32 after the time point T31, and the state of the switching element SW11 is set to the ON state. At this time, the power source voltage VDD is input to the first terminal TC121 of the capacitance element C12 via the switching element SW11. The voltage of the driving signal PCK11 is set to the H voltage at a time point T33 after the time point T32, and the power source voltage VDD is input to the second terminal TC122 of the capacitance element C12.

The voltage of the control signal PSW11 is set to the H voltage at a time point T34 after the time point T33, and the state of the switching element SW11 is set to the OFF state. The voltage of the control signal PSW12 is set to the L voltage at a time point T35 after the time point T34, and the state of the switching element SW12 is set to the ON state.

The voltage of the driving signal PCK11 is set to the L voltage at a time point T36 after the time point T35, and the ground voltage VSS is input to the second terminal TC122 of the capacitance element C12. When the voltage of the driving signal PCK11 changes from the H voltage to the L voltage, the voltage at the first terminal TC121 of the capacitance element C12 decreases. The lower positive voltage than the power source voltage VDD is generated at the first terminal TC121 of the capacitance element C12.

In the example shown in FIG. 7, after the state of the switching element SW12 is set to the ON state at the time point T35, the ground voltage VSS is input to the second terminal TC122 of the capacitance element C12 at the time point T36. The state of the switching element SW12 may be set to the ON state after the ground voltage VSS is input to the second terminal TC122 of the capacitance element C12.

The following Expression (5) shows a value Vddl of the positive voltage generated at the first terminal TC121 of the capacitance element C12. A voltage value Vdd in Expression (5) indicates the value of the power source voltage VDD, and a voltage value Vss in Expression (5) indicates the value of the ground voltage VSS. A capacitance value C1 in Expression (5) indicates the capacitance value of the capacitance element C11, and a capacitance value C2 in Expression (5) indicates the capacitance value of the capacitance element C12.

[Math. 5]

$$Vddl = \frac{C1}{C1 + C2} \times (Vss - Vdd) + Vdd \quad (5)$$

For example, the capacitance value C1 is 0.5 [pF], and the capacitance value C2 is 2.8 [pF]. For example, the voltage value Vdd is 3.3 [V], and the voltage value Vss is 0 [V]. In this example, the value Vddl of the positive voltage is 2.8 [V].

In the above-described example, the L voltage of the driving signal PCK11 is the ground voltage VSS, and the H voltage of the driving signal PCK11 is the power source voltage VDD. The voltage of the driving signal PCK11 is not limited to this example.

A charge carrier (electron/hole) in accordance with the positive voltage generated at the first terminal TC121 of the capacitance element C12 is transferred to the first terminal TC131 of the capacitance element C13. The booster circuit 300 repeats the above-described operation. Therefore, the voltage at the first terminal TC131 of the capacitance element C13 approaches the positive voltage generated at the first terminal TC121 of the capacitance element C12.

The following Expression (6) shows a value Vout of the output voltage VOUT after the positive voltage generated at the first terminal TC121 of the capacitance element C12 is transferred to the first, terminal TC131 of the capacitance element C13 n times. A voltage value Vdd in Expression (6) indicates the value of the power source voltage VDD, and a voltage value Vddl in Expression (6) indicates the value of the positive voltage. A capacitance value C1 in Expression (6) indicates the capacitance value of the capacitance element C11, a capacitance value C2 in Expression (6) indicates the capacitance value of the capacitance element C12, and a capacitance value C3 in Expression (6) indicates the capacitance value of the capacitance element C13. When the number n is infinite, the value Vout of the output voltage VOU converges to the voltage value Vddl.

[Math. 6]

$$Vout = Vdd + (Vddl - Vdd) \times \left[1 - \left\{\frac{(C1 + C2)C3}{C1C2 + C2C3 + C3C1}\right\}^n\right] \quad (6)$$

In the second modified example of the first embodiment, the voltage generation circuit 8 can generate a necessary voltage fir the operation of the imaging device 1 without increasing the circuit scale. In the second modified example of the first embodiment, the miniaturization of the imaging device 1 is realized.

Second Embodiment

Figure 8:
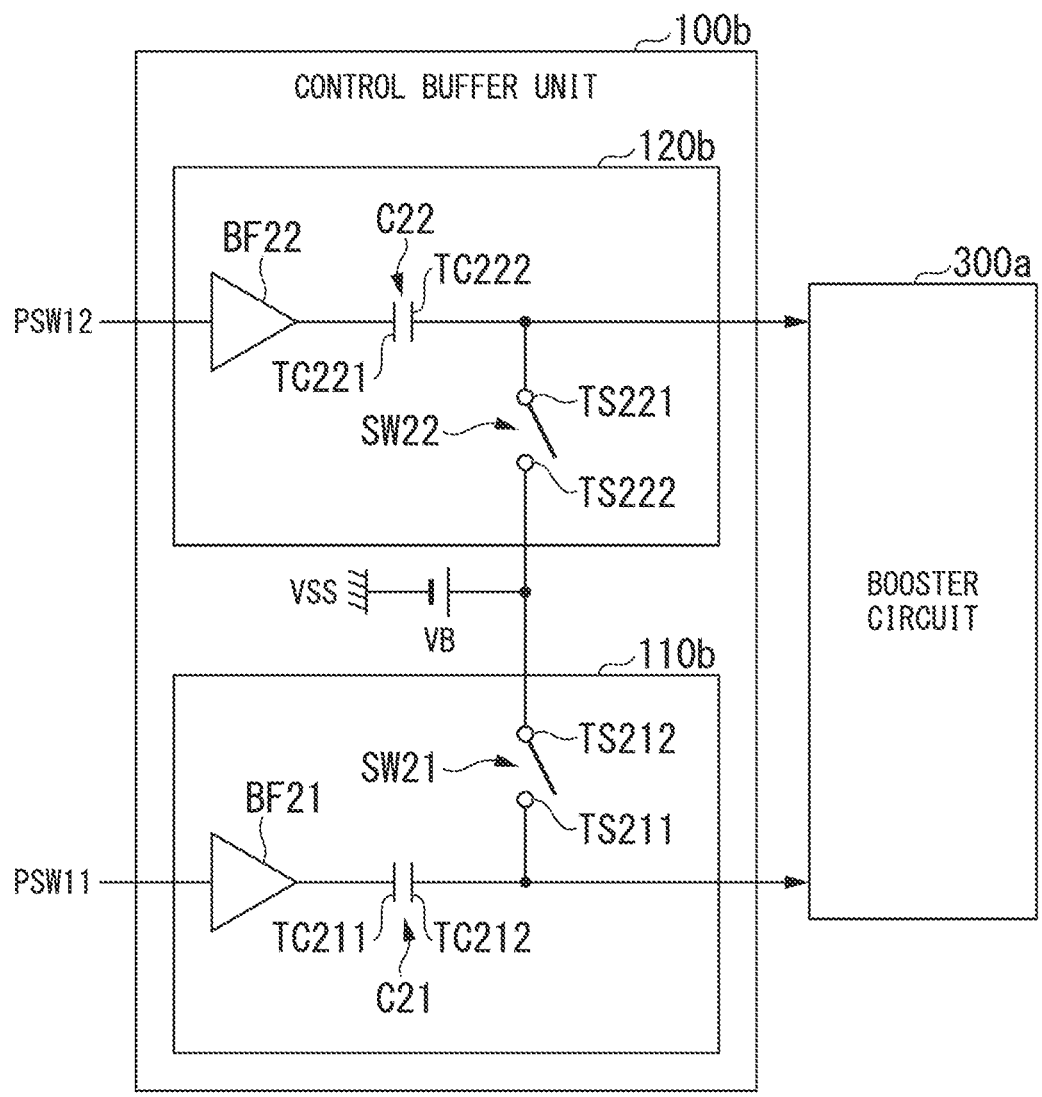
FIG. 8 is a circuit diagram showing a configuration of a control buffer unit in an imaging device according to a second embodiment of the present invention.

A second embodiment of the present invention will be described. In the imaging device 1 according to the second embodiment, the control buffer unit 100 of the voltage generation circuit 8a shown in FIG. 5 is changed to a control buffer unit 100b shown in FIG. 8. FIG. 8 shows a configuration of the control buffer unit 100b. The control buffer unit 100b shown in FIG. 8 includes a control buffer II Ob and a control buffer 120b.

The control buffer 110b includes a buffer circuit BF21, a capacitance element C21, and a switching, element SW21. The control buffer 110b is a bootstrap circuit. The capacitance element C21 includes a first terminal TC211 and a second terminal TC212. The switching element SW21 includes a first terminal TS211 and a second terminal TS212.

A control signal PSW11 having an H voltage or an L voltage is input to the buffer circuit BF21. The H voltage of the control signal PSW11 is the power source voltage VDD, and the L voltage of the control signal PSW11 is the ground voltage VSS (fourth voltage). The buffer circuit 1321 outputs the control signal PSW11 to the capacitance element C21.

The control signal PSW11 output from the buffer circuit BF21 is input to the first terminal TC211 of the capacitance element C21. The second terminal TC212 of the capacitance element C21 is connected to the first terminal TS211 of the switching element SW21. The voltage at the second terminal TC212 of the capacitance element C21 is output to the gate terminal TS113 of the switching element SW11 in the booster circuit 300a.

A voltage VB is input to the second terminal TS212 of the switching element SW21. The voltage VB is higher than the ground voltage VSS and is lower than the power source voltage VDD. The state of the switching element SW21 becomes any one of an ON state and an OFF state.

The voltage at the second terminal TC212 of the capacitance element C21 changes in accordance with a change of the voltage of the control signal PSW11. The control buffer 110b outputs the control signal PSW11 having a positive voltage in accordance with the voltage VB as the H voltage to the gate terminal TS113 of the switching element SW11. In addition, the control buffer 110b generates a lower negative voltage than the ground voltage VSS (fourth voltage) and outputs the control signal PSW11 having the generated negative voltage as the L voltage to the gate terminal TS113 of the switching element SW11.

The control buffer 120b includes a buffer circuit BF22, a capacitance element C22, and a switching element SW22. The control buffer 120b is a bootstrap circuit. The capacitance element C22 includes a first terminal TC221 and a second terminal TC222. The switching element SW22 includes a first terminal TS221 and a second terminal TS222.

A control signal PSW12 having an H voltage or an L voltage is input to the buffer circuit BF22. The H voltage of the control signal PSW12 is the power source voltage VDD, and the L voltage of the control signal PSW12 is the ground voltage VSS (fourth voltage). The buffer circuit BF22 outputs the control signal PSW12 to the capacitance element C22.

The control signal PSW12 output from the buffer circuit BF22 is input to the first terminal TC221 of the capacitance element C22. The second terminal TC222 of the capacitance element C22 is connected to the first terminal TS221 of the switching element SW22. The voltage at the second terminal TC222 of the capacitance element C22 is output to the gate terminal TS123 of the switching element SW12 in the booster circuit 300a. The voltage VB is input to the second terminal TS222 of the switching element SW22. The state of the switching element SW22 becomes any one of an ON state and an OFF state.

The voltage at the second terminal TC222 of the capacitance element C22 changes in accordance with a change of the voltage of the control signal PSW12. The control buffer 120b outputs the control signal PSW12 having a positive voltage in accordance with the voltage VB as the H voltage to the gate terminal TS123 of the switching element SW12. In addition, the control buffer 120b generates a lower negative voltage than the ground voltage VSS (fourth voltage) and outputs the control signal PSW12 having the generated negative voltage as the L voltage to the gate terminal TS123 of the switching element SW12.

An operation of the control buffer 110b will be described. Since an operation of the control buffer 120b is similar to that of the control buffer 110b, descriptions of the operation of the control buffer 120b will be omitted.

When the voltage of the control signal PSW11 is the H voltage, the state of the switching element SW21 is set to the ON state. At this time, the power source voltage VDD is input to the first terminal TC211 of the capacitance element C21, and the voltage at the second terminal TC212 of the capacitance element C21 is set to a positive voltage in accordance with the voltage VB. The control buffer 110b outputs the control signal PSW11 having the positive voltage as the H voltage to the gate terminal TS113 of the switching element SW11.

After the state of the switching element SW21 is set to the OFF state, the voltage of the control signal PSW11 is set to the L voltage and the ground voltage VSS is input to the first terminal TC211 of the capacitance element C21. At this time, the voltage at the second terminal TC212 of the capacitance element C21 decreases. A lower negative voltage than the ground voltage VSS is generated at the second terminal TC212 of the capacitance element C21. The control buffer 110b outputs the control signal PSW11 having the negative voltage as the L voltage to the gate terminal TS113 of the switching element SW11.

The control buffer unit 100b outputs the control signal PSW11, which has the positive voltage in accordance with the voltage VB or has the lower negative voltage than the ground voltage VSS, to the gate terminal TS113 of the switching element SW11. In addition, the control buffer unit 100b outputs the control signal PSW12, which has the positive voltage in accordance with the voltage VB or has the lower negative voltage than the ground voltage VSS, to the gate terminal TS123 of the switching element SW12. The control buffer unit 100b can set the switching elements SW11 and SW12 to be in the OFF state by using the lower negative voltage than the around voltage VSS. The negative voltage generated by the booster circuit 300a may be input to a back gate of each of the switching elements SW11 and SW12.

Each of the switching elements SW11 and SW12 does not need to be an enhancement-type or strong-enhancement-type PMOS transistor.

In the second embodiment, the control buffer unit 100b generates the lower negative voltage than the ground voltage VSS by using, the ground voltage VSS without using the negative voltage generated by the booster circuit 300a. The voltage generation circuit 8a sets the switching elements SW11 and SW12 to be in the OFF state by using the negative voltage generated by the control buffer unit 100b. Therefore, the voltage generation circuit 8a can generate a necessary voltage for the operation of the imaging device 1 without increasing the circuit scale.

The negative voltage generated by the booster circuit 300a does not need to be provided to the control buffer unit 100b. Since the capacitance element C13 is miniaturized, the miniaturization of the imaging device 1 is realized.

The control buffer unit 100b is configured as a bootstrap circuit. In the second embodiment, the miniaturization of the voltage generation circuit 8a is easily realized.

Modified Example of Second Embodiment

A modified example of the second embodiment of the present invention will be described. The control buffer unit 100b may generate a higher positive voltage than the power source voltage VDD. Hereinafter, an example in which the control buffer unit 100b generates a higher positive voltage than the power source voltage VDD will be described. The control buffer unit 100 of the voltage generation circuit 8 shown in FIG. 2 is changed to a control buffer unit 100b shown in FIG. 8.

The voltage at the second terminal TC212 of the capacitance element C21 changes in accordance with a change of the voltage of the control signal PSW11. The control buffer 110b outputs the control signal PSW11 having a positive voltage in accordance with the voltage VB as the L voltage to the gate terminal TS113 of the switching element SW11. In addition, the control buffer 110b generates a higher positive voltage than the power source voltage VDD (third voltage) and outputs the control signal PSW11 having the generated positive voltage as the H voltage to the gate terminal TS113 of the switching element SW11.

The voltage at the second terminal TC222 of the capacitance element C22 changes in accordance with a change of the voltage of the control signal PSW12. The control buffer 120b outputs the control signal PSW12 having a positive voltage in accordance with the voltage VB as the L voltage to the gate terminal TS123 of the switching element SW12. In addition, the control buffer 120b generates a higher positive voltage than the power source voltage VDD (third voltage) and outputs the control signal PSW12 having the generated positive voltage as the H voltage to the gate terminal TS123 of the switching element SW12.

An operation of the control buffer 110b will be described. Since an operation of the control buffer 120b is similar to that of the control buffer 110b, descriptions of the Operation of the control buffer 120b will be omitted.

When the voltage of the control signal PSW11 is the L voltage, the state of the switching element SW21 is set to the ON state. At this time, the ground voltage VSS is input to the first terminal TC211 of the capacitance element C21, and the voltage at the second terminal TC212 of the capacitance element C21 is set to a positive voltage in accordance with the voltage VB. The control buffer 110b outputs the control signal PSW11 having the positive voltage as the L voltage to the gate terminal TS113 of the switching element SW11.

After the state of the switching element SW21 is set to the OFF state, the voltage of the control signal PSW11 is set to the H voltage and the power source voltage VDD is input to the first terminal TC211 of the capacitance element C21. At this time, the voltage at the second terminal TC212 of the capacitance element C21 increases. A higher positive voltage than the power source voltage VDD is generated at the second terminal TC212 of the capacitance element C21. The control buffer 110b outputs the control signal PSW11 having the positive voltage as the H voltage to the gate terminal TS113 of the switching element SW11.

The control buffer unit 100b outputs the control signal PSW11, which has the higher positive voltage than the power source voltage VDD or has the positive voltage in accordance with the voltage VB, to the gate terminal TS113 of the switching element SW11. In addition, the control buffer unit 100b outputs the control signal PSW12, which has the higher positive voltage than the power source voltage VDD or has the positive voltage in accordance with the voltage VB, to the gate terminal TS123 of the switching element SW12. The control buffer unit 100b can set the switching elements SW11 and SW12 to be in the OFF state by using the higher positive voltage than the power source voltage VDD. The positive voltage generated by the booster circuit 300 may be input to a hack gate of each of the switching elements SW11 and SW12.

Each of the switching elements SW11 and SW12 does not need to be an enhancement-type or strong-enhancement-type NMOS transistor.

The positive voltage generated by the booster circuit 300 does not need to be provided to the control buffer unit 100b. Since the capacitance element C13 is miniaturized, the miniaturization of the imaging device 1 is realized.

Third Embodiment

A third embodiment of the present invention will be described. In the imaging device 1 according to the third embodiment, the voltage generation circuit 8 shown in FIG. 2 is changed to a voltage generation circuit 8c shown in FIG. 9.

Figure 9:
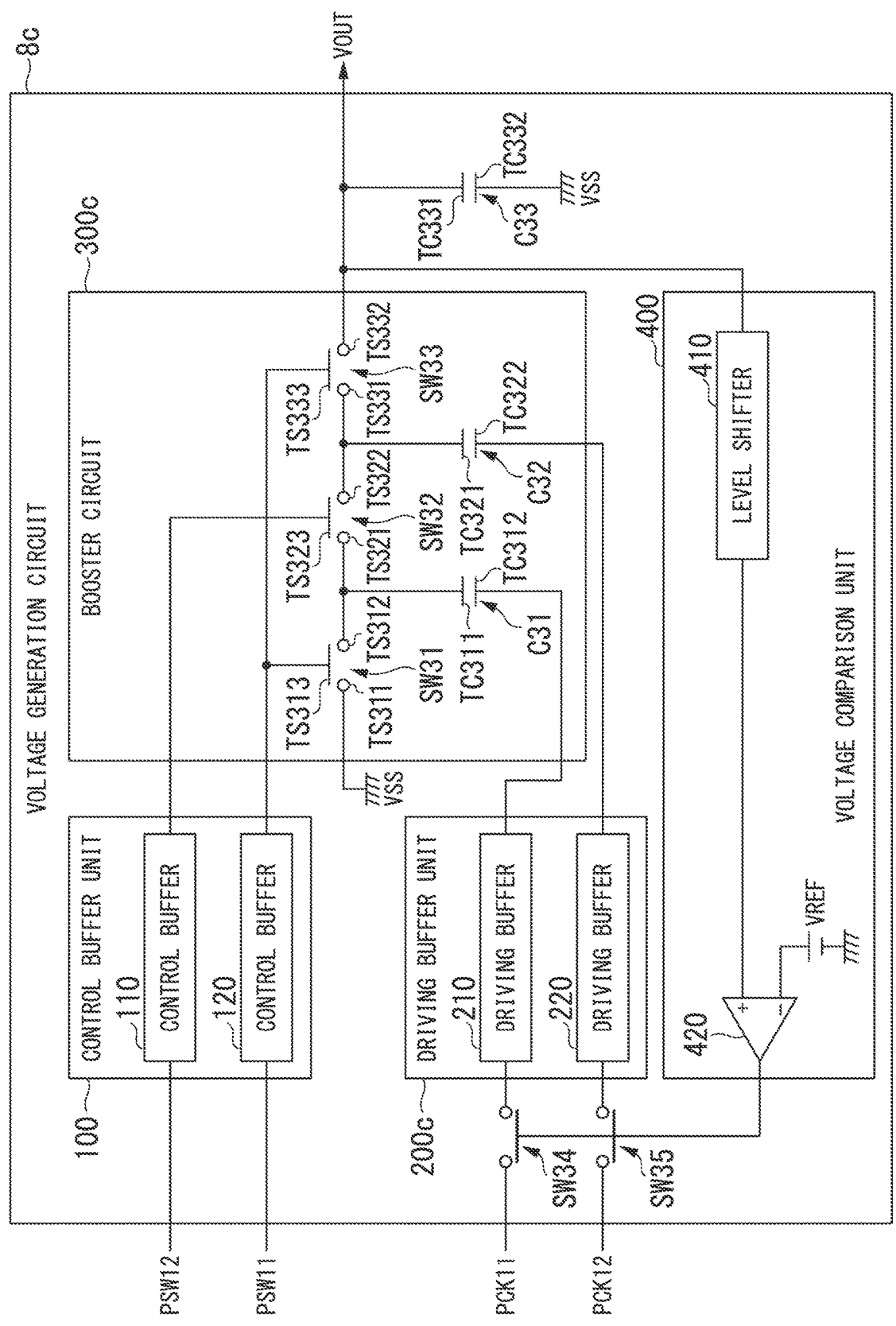
FIG. 9 is a circuit diagram showing a configuration of a voltage generation circuit in an imaging device according to a third embodiment of the present invention.

The voltage generation circuit 8c shown in FIG. 9 includes a control huller unit 100, a driving buffer unit 200e, a booster circuit 300c, a voltage comparison unit 400, a capacitance element C33, a switching element SW34, and a switching element SW35.

The control buffer unit 100 includes a control buffer 110 and a control buffer 120. The control buffer 110 outputs a control signal PSW11 having an H voltage or an L voltage to the booster circuit 300c. The control buffer 120 outputs a control signal PSW12 having an H voltage or an L voltage to the booster circuit 300c. The H voltage of each of the control signals is the power source voltage VDD and the L voltage of each of the control signals is the ground voltage VSS (fourth voltage).

The driving buffer unit 200c includes a driving buffer 210 and a driving buffer 220. The power source voltage VDD and the ground voltage VSS are input to the driving buffer 210 and the driving buffer 220. The driving buffer 210 outputs a driving signal PCK11 having an H voltage or an L voltage to the booster circuit 300c. The driving buffer 220 outputs a driving signal PCK12 having an H voltage or an L voltage to the booster circuit 300c. The H voltage of each of the driving signals is the power source voltage VDD, and the L voltage of each of the driving signals is the ground voltage VSS (sixth voltage).

The booster circuit 300c includes a switching element SW31, a switching element SW32, a switching element SW33, a capacitance element C31, and a capacitance element C32. The booster circuit 300c is a charge-pump-type booster circuit including a plurality of pumping packets. Each of the pumping packets includes a switching element (transistor) and a capacitance element.

In the example shown in FIG. 9, the booster circuit 300c includes two pumping packets. A first pumping packet includes the switching element SW31, the switching element SW32, and the capacitance element C31. A second pumping packet includes the switching element SW32, the switching element SW33, and the capacitance element C32. The booster circuit 300c may include only one pumping packet. The booster circuit 300c may include three or more pumping packets.

Each of the switching elements SW31, SW32, and SW33 is an NMOS transistor and includes a first terminal, a second terminal, and a gate terminal. One of the first and second terminals is a source terminal, and the other of the first and second terminals is a drain terminal. The switching element SW31 includes a first terminal TS311, a second terminal TS312, and a gate terminal TS313. The switching element SW32 includes a first terminal TS321, a second terminal TS322, and a gate terminal TS323. The switching element SW33 includes a first terminal TS331, a second terminal TS332, and a gate terminal TS333.

The ground voltage VSS is input to the first terminal TS311 of the switching element SW31. The control signal PSW11 is input to the gate terminal TS313 of the switching element SW31. The first terminal TS321 of the switching element SW32 is connected to the second terminal TS312 of the switching element SW31. The control signal PSW12 is input to the gate terminal TS323 of the switching element SW32. The first terminal TS331 of the switching element SW33 is connected to the second terminal TS322 of the switching element SW32. The control signal PSW11 is input to the gate terminal TS333 of the switching element SW33.

The capacitance element C31 includes a first terminal TC311 and a second terminal TC312. The capacitance element C32 includes a first terminal TC321 and a second terminal TC322.

The first terminal TC311 of the capacitance element C31 is connected to the second terminal TS312 of the switching element SW31 and the first terminal TS321 of the switching element SW32. The driving signal PCK11 is input to the second terminal TC312 of the capacitance element C31. The second terminal TC321 of the capacitance element C32 is connected to the second terminal TS322 of the switching element SW32 and the first terminal TS331 of the switching element SW33. The driving signal PCK12 is input to the second terminal TC322 of the capacitance element C32.

The state of each of the switching elements SW31, SW32, and SW33 becomes any one of an ON state and an OFF state. The state of the switching element SW31 is controlled based on the control signal PSW11. The state of the switching element SW32 is controlled based on the control signal PSW12. The state of the switching element SW33 is controlled based on the control signal PSW11. When the voltage of each of the control signals is the H voltage, the state of each of the switching elements is the ON state. When the voltage of each of the control signals is the L voltage, the state of each of the switching elements is the OFF state.

For example, each of the switching elements SW31, SW32, and SW33 is an enhancement-type NMOS transistor having a positive threshold voltage. Each of the switching elements SW31, SW32, and SW33 may be a strong-enhancement-type NMOS transistor.

The capacitance element C31 is driven based on the driving signal PCK11. The voltage at the first terminal TC311 of the capacitance element C31 changes in accordance with a change of the voltage of the driving signal PCK11. The capacitance element C32 is driven based on the driving signal PCK12. The voltage at the first terminal TC321 of the capacitance element C32 changes in accordance with a change of the voltage of the driving signal PCK12.

The booster circuit 300c generates a lower negative voltage (second voltage) than the ground voltage VSS. The driving buffer unit 200c drives the capacitance elements C31 and C32 by using the ground voltage VSS (sixth voltage). The voltage used for driving the capacitance elements C31 and C32 is higher than the negative voltage generated by the booster circuit 300c and is lower than or equal to the ground voltage VSS.

The capacitance element C33 includes a first terminal TC331 and a second terminal TC332. The first terminal TC331 of the capacitance element C33 is connected to the second terminal TS332 of the switching element SW33. The ground voltage VSS is input to the second terminal TC332 of the capacitance element C33. The capacitance element C33 holds the negative voltage (second voltage) generated by the booster circuit 300c and outputs the negative voltage as an output voltage VOUT.

The control buffer unit 100 outputs the control signal PSW11 having either the power source voltage VDD or the ground voltage VSS to the gate terminal TS313 of the switching element SW31 and the gate terminal TS333 of the switching element SW33. In addition, the control buffer unit 100 outputs the control signal PSW12 having either the power source voltage VDD or the ground voltage VSS to the gate terminal TS323 of the switching element SW32. The negative voltage generated by the booster circuit 300c is not input to the control buffer unit 100. Since the switching elements SW31. SW32, and SW33 have the positive threshold voltage, the control buffer unit 100 can set the switching elements SW31, SW32, and SW33 to be in the OFF state by using the ground voltage VSS without using a lower negative voltage than the ground voltage VSS. The control buffer unit 100 may be changed to the control buffer unit 100b shown in FIG. 8. The negative voltage generated by the booster circuit 300c may be input to a hack gate of each of the switching elements SW31, SW32, and SW33.

An operation of the voltage generation circuit 8c will be described. The voltage of the control signal PSW12 is set to the L voltage, and the state of the switching element SW32 is set to the OFF state. Thereafter, the voltage of the control signal PSW11 is set to the H voltage, and the state of the switching element SW31 is set to the ON state. At this time, the ground voltage VSS is input to the first terminal TC311 of the capacitance element C31 via the switching element SW31. Thereafter, the voltage of the driving signal PCK11 is set to the H voltage, and the power source voltage VDD is input to the second terminal TC312 of the capacitance element C31.

The voltage of the control signal PSW11 is set to the L voltage, and the state of the switching element SW31 is set to the OFF state. Thereafter, the voltage of the control signal PSW12 is set to the H voltage, and the state of the switching element SW32 is set to the ON state.

The voltage of the driving signal PCK11 is set to the L voltage, and the ground voltage VSS is input to the second terminal TC312 of the capacitance element C31. When the voltage of the driving signal PCK11 changes from the H voltage to the L voltage, the voltage generated by the pumping packet including the capacitance element C31 decreases. A lower negative voltage than the ground voltage VSS is generated at the first terminal TC311 of the capacitance element C31.

The negative voltage generated at the first terminal TC311 Of the capacitance element C31 is input to the first terminal TC321 of the capacitance element C32 via the switching element SW32. Thereafter, the voltage of the driving signal PCK12 is set to the H voltage, and the power source voltage VDD is input to the second terminal TC322 of the capacitance element C32.

The voltage of the control signal PSW12 is set to the L voltage, and the state of the switching element SW32 is set to the OFF state. Thereafter, the voltage of the control signal PSW11 is set to the H voltage, and the state of the switching element SW33 is set to the ON state.

The voltage of the driving signal PCK12 is set to the L voltage, and the ground voltage VSS is input to the second terminal TC322 of the capacitance element C32. When the voltage of the driving signal PCK12 changes from the H voltage to the L voltage, the voltage generated by the pumping packet including the capacitance element C32 decreases. A lower negative voltage than the negative voltage generated at the first terminal TC311 of the capacitance element C31 is generated at the first terminal TC321 of the capacitance element C32.

The negative voltage generated at the first terminal TC321 of the capacitance element C32 is input to the first terminal TC331 of the capacitance element C33 via the switching element SW33. The booster circuit 300c generates a lower negative voltage than the ground voltage VSS. The capacitance element C33 holds the negative voltage generated by the booster circuit 300c.

The voltage comparison unit 400 includes a level shifter 410 and a comparator 420. The negative voltage generated by the booster circuit 300c is input to the level shifter 410. The level shifter 410 converts the negative voltage into a comparison voltage ranging from the ground voltage VSS to the power source voltage. The comparison voltage and a voltage VREF are input to the comparator 420. The comparator 420 outputs a control signal in accordance with a result of comparing the comparison voltage with the voltage VREF to the switching elements SW34 and SW35.

The states of the switching elements SW34 and SW35 are controlled based on the control signal output from the comparator 420. When the comparison voltage has not reached a predetermined voltage, the switching element SW34 outputs the driving signal PCK11 to the driving buffer 210 and the switching element SW35 outputs the driving signal PCK12 to the driving buffer 220. When the comparison voltage has reached the predetermined voltage, the switching element SW34 stops the output of the driving signal PCK11 and the switching element SW35 stops the output of the driving signal PCK12. The booster circuit 300c stops the generation of the lower negative voltage than the ground voltage VSS.

In the third embodiment, the voltage generation circuit 8c sets the switching elements SW31, SW32, and SW33 to be in the ON state by using the power source voltage VDD. In addition, the voltage generation circuit 8c sets the switching elements SW31, SW32, and SW33 to be in the OFF state by using the ground voltage VSS without using the negative voltage generated by the booster circuit 300c. Therefore, the voltage generation circuit 8c can generate a necessary voltage for the operation of the imaging device 1 without increasing the circuit scale.

The negative voltage generated by the booster circuit 300c does not deed to be provided to the control buffer unit 100. Since the capacitance element C33 is miniaturized, the miniaturization of the imaging device 1 is realized.

The booster circuit 300c is configured as a charge-pump-type booster circuit. In the third embodiment, the miniaturization of the voltage generation circuit 8c is easily realized.

Modified Example of Third Embodiment

Figure 10:
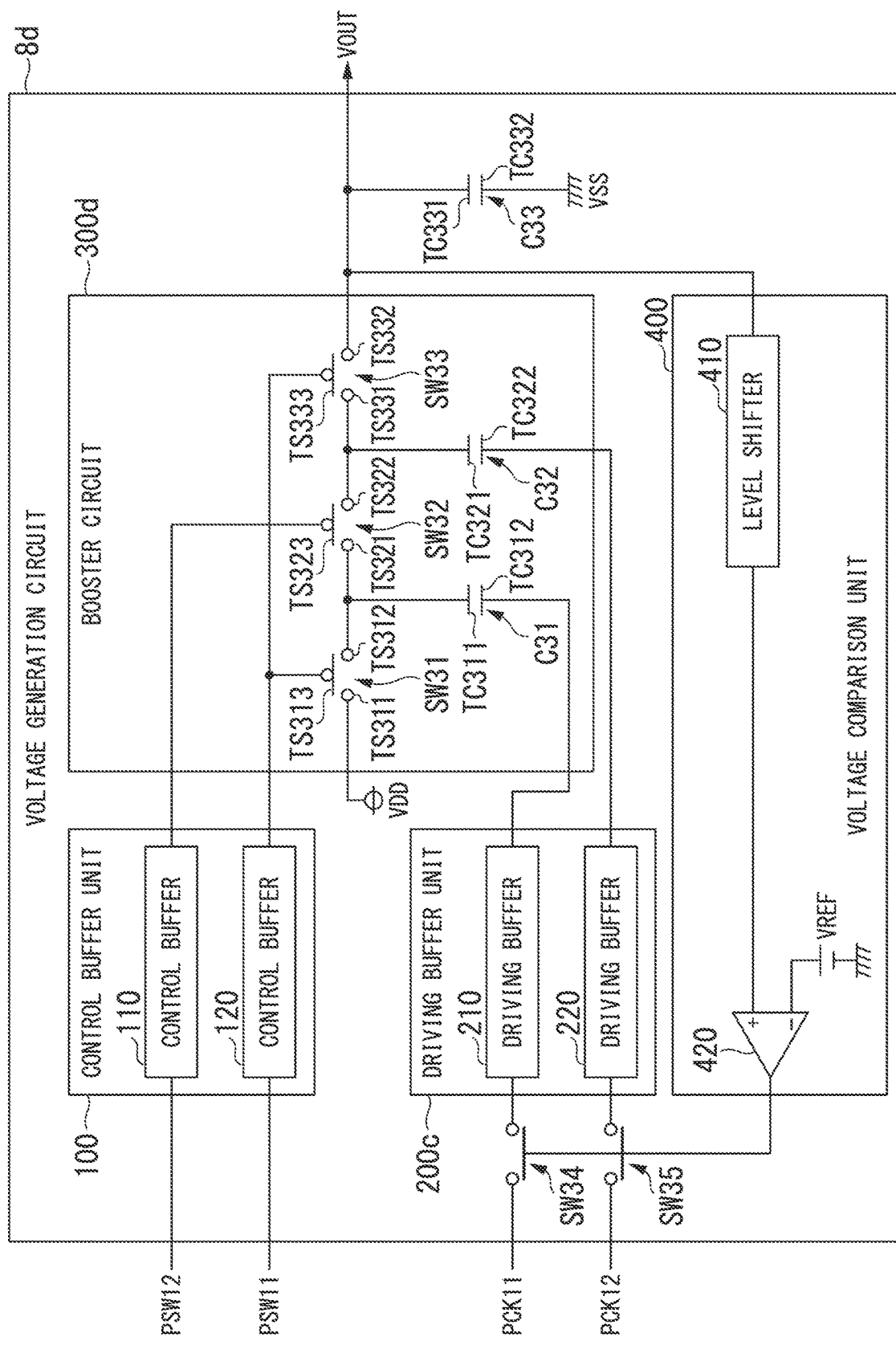
FIG. 10 is a circuit diagram showing a configuration of a voltage generation circuit in an imaging device according to a modified example of the third embodiment of the present invention.

A modified example of the third embodiment of the present invention will be described. In the imaging device 1 according to the modified example of the third embodiment, the voltage generation circuit 8c shown in FIG. 9 is changed to a voltage generation circuit 8d shown in FIG. 10. FIG. 10 shows a configuration of the voltage generation circuit 8d. The voltage generation circuit 8d shown in FIG. 10 includes a control buffer unit 100, a driving buffer unit 200c, a booster circuit 300d, a voltage comparison unit 400, a capacitance element C33, a switching element SW34, and a switching element SW35. Inscriptions of the same configuration as that shown in FIG. 9 will be omitted.

The control buffer unit 100 includes a control huller 110 and a control buffer 120. The control buffer 110 outputs a control signal PSW11 having an H voltage or an L voltage to the booster circuit 300d. The control buffer 120 outputs a control signal PSW12 having an H voltage or an L voltage to the booster circuit 300d. The H voltage of each of the control signals is the power source voltage VDD (third voltage), and the L voltage of each of the control signals is the ground voltage VSS.

The driving buffer unit 200c includes a driving buffer 210 and a driving, buffer 220. The driving buffer 210 outputs a driving signal PCK11 having an H voltage or an L voltage to the booster circuit 300d. The driving buffer 220 outputs a driving signal PCK12 having an H voltage or an L voltage to the booster circuit 300d. The H voltage of each of the driving signals is the power source voltage VDD (fifth voltage), and the L voltage of each of the driving signals is the ground voltage VSS.

The booster circuit 300d includes a switching element SW31, a switching element SW32, a switching element SW33, a capacitance element C31, and a capacitance element C32. The booster circuit 300d is a charge-pump-type booster circuit including a plurality of pumping packets.

Each of the switching elements SW31, SW32, and SW33 is a PMOS transistor. Terminals included in each of the switching elements are the same as those included in each of the switching elements shown in FIG. 9. Terminals included in each of the capacitance elements are the same as those included in each of the capacitance elements shown in FIG. 9.

The power source voltage VDD is input to the first terminal TS311 of the switching element SW31. The control signal PSW11 is input to the gate terminal TS313 of the switching element SW31. The control signal PSW12 is input to the gate terminal TS323 of the switching element SW32. The control signal PSW11 is input to the gate terminal TS333 of the switching element SW33.

When the voltage of each of the control signals is the L voltage, the state of each of the switching elements is the ON state. When the voltage of each of the control signals is the H voltage, the state of each of the switching elements is the OFF state.

For example, each of the switching elements SW31, SW32, and SW33 is an enhancement-type PMOS transistor having a negative threshold voltage. Each of the switching elements SW31, SW32, and SW33 may be a strong-enhancement-type PMOS transistor.

The capacitance element C31 is driven based on the driving signal PCK11. The voltage at the first terminal TC311 of the capacitance element C31 changes in accordance with a change of the voltage of the driving signal PCK11. The capacitance element C32 is driven based on the driving signal PCK12. The voltage at the first terminal TC321 of the capacitance element C32 changes in accordance with a change of the voltage of the driving signal PCK12.

The booster circuit 300d generates a higher positive voltage (first voltage) than the power source voltage VDD. The driving buffer unit 200c drives the capacitance elements C31 and C32 by using the power source voltage VDD (fifth voltage). The voltage used for driving the capacitance elements C31 and C32 is lower than the positive voltage generated by the booster circuit 300d and is higher than or equal to the ground voltage VSS.

The capacitance element C33 holds the positive voltage (first voltage) generated by the booster circuit 300d and outputs the positive voltage as an output voltage VOUT.

The control buffer unit 100 outputs the control signal PSW11 having either the power source voltage VDD or the ground voltage VSS to the gate terminal TS313 of the switching element SW31 and the gate terminal TS333 of the switching element SW33. In addition, the control buffer unit 100 outputs the control signal PSW12 having either the power source voltage VDD or the ground voltage VSS to the gate terminal TS323 of the switching element SW32. The positive voltage generated by the booster circuit 300d is not input to the control buffer unit 100. Since the switching elements SW31, SW32, and SW33 have the negative threshold voltage, the control buffer unit 100 can set the switching elements SW31, SW32, and SW33 to be in the OFF state by using the power source voltage VDD without using a higher positive voltage than the power source voltage VDD. The control buffer unit 100 may be changed to the control huller unit 100b shown in FIG. 8. The positive voltage generated by the booster circuit 300d may be input to a hack gate of each of the switching elements SW31, SW32, and SW33.

An operation of the voltage generation circuit 8d will be described. The voltage of the control signal PSW12 is set to the H voltage, and the state of the switching element SW32 is set to the OFF state. Thereafter, the voltage of the control signal PSW11 is set to the L voltage, and the state of the switching element SW31 is set to the ON state. At this time, the power source voltage VDD is input to the first terminal TC311 of the capacitance element C31 via the switching element SW31. Thereafter, the voltage of the driving signal PCK11 is set to the L voltage, and the ground voltage VSS is input to the second terminal TC312 of the capacitance element C31.

The voltage of the control signal PSW11 is set to the H voltage, and the state of the switching element SW31 is set to the OFF state. Thereafter, the voltage of the control signal PSW12 is set to the L voltage, and the state of the switching element SW32 is set to the ON state.

The voltage of the driving signal PCK11 is set to the H voltage, and the power source voltage VDD is input to the second terminal TC312 of the capacitance element C31. When the voltage of the driving signal PCK11 changes from the L voltage to the H voltage, the voltage generated by the pumping packet including the capacitance element C31 increases. A higher positive voltage than the power source voltage VDD is generated at the first terminal TC311 of the capacitance element C31.

The positive voltage generated at the first terminal TC311 of the capacitance element C31 is input to the first terminal TC321 of the capacitance element C32 via the switching element SW32. Thereafter, the voltage of the driving signal PCK12 is set to the L voltage, and the ground voltage VSS is input to the second terminal TC322 of the capacitance element C32.

The voltage of the control signal PSW12 is set to the H voltage, and the state of the switching element SW32 is set to the OFF state. Thereafter, the voltage of the control signal PSW11 is set to the L voltage, and the state of the switching element SW33 is set to the ON state.

The voltage of the driving signal PCK12 is set to the H voltage, and the power source voltage VDD is input to the second terminal TC322 of the capacitance element C32. When the voltage of the driving signal PCK12 changes from the L voltage to the H voltage, the voltage generated by the pumping packet including the capacitance element C32 increases. A higher positive voltage than the positive voltage generated at the first terminal TC311 of the capacitance element C31 is generated at the first terminal TC321 of the capacitance element C32.

The positive voltage generated at the first terminal TC321 of the capacitance element C32 is input to the first terminal TC331 of the capacitance element C33 via the switching element SW33. The booster circuit 300d generates a higher positive voltage than the power source voltage VDD. The capacitance element C33 holds the positive voltage generated by the booster circuit 300d.

The voltage comparison unit 400 includes a level shifter 410 and a comparator 420. The positive voltage generated by the booster circuit 300d is input to the level shifter 410. The level shifter 410 converts the positive voltage into a comparison voltage ranging from the ground voltage VSS to the power source voltage. The comparison voltage and a voltage VREF are input to the comparator 420. The comparator 420 outputs a control signal in accordance with a result of comparing the comparison voltage with the voltage VREF to the switching elements SW34 and SW35.

The states of the switching elements SW34 and SW35 are controlled based on the control signal output from the comparator 420. When the comparison voltage has not readied a predetermined voltage, the switching element SW34 outputs the driving signal PCK11 to the driving buffer 210 and the switching element SW35 outputs the driving signal PCK12 to the driving buffer 220. When the comparison voltage has reached the predetermined voltage, the switching element SW34 stops the output of the driving signal PCK11 and the switching element SW35 stops the output of the driving signal PCK12. The booster circuit 300d stops the generation of the higher positive voltage than the power source voltage VDD.

In the modified example of the third embodiment, the voltage generation circuit 8d sets the switching elements SW31, SW32, and SW33 to be in the ON state by using the ground voltage VSS. In addition, the voltage generation circuit 8d sets the switching elements SW31, SW32, and SW33 to be in the OFF state by using the power source voltage VDD without using the positive voltage generated by the booster circuit 300d. Therefore, the voltage generation circuit 8d can generate a necessary voltage for the operation of the imaging device 1 without increasing the circuit scale.

The positive voltage generated by the booster circuit 300d does not need to be provided to the control buffer unit 100. Since the capacitance element C33 is miniaturized, the miniaturization of the imaging device 1 is realized.

Fourth Embodiment

Figure 11:
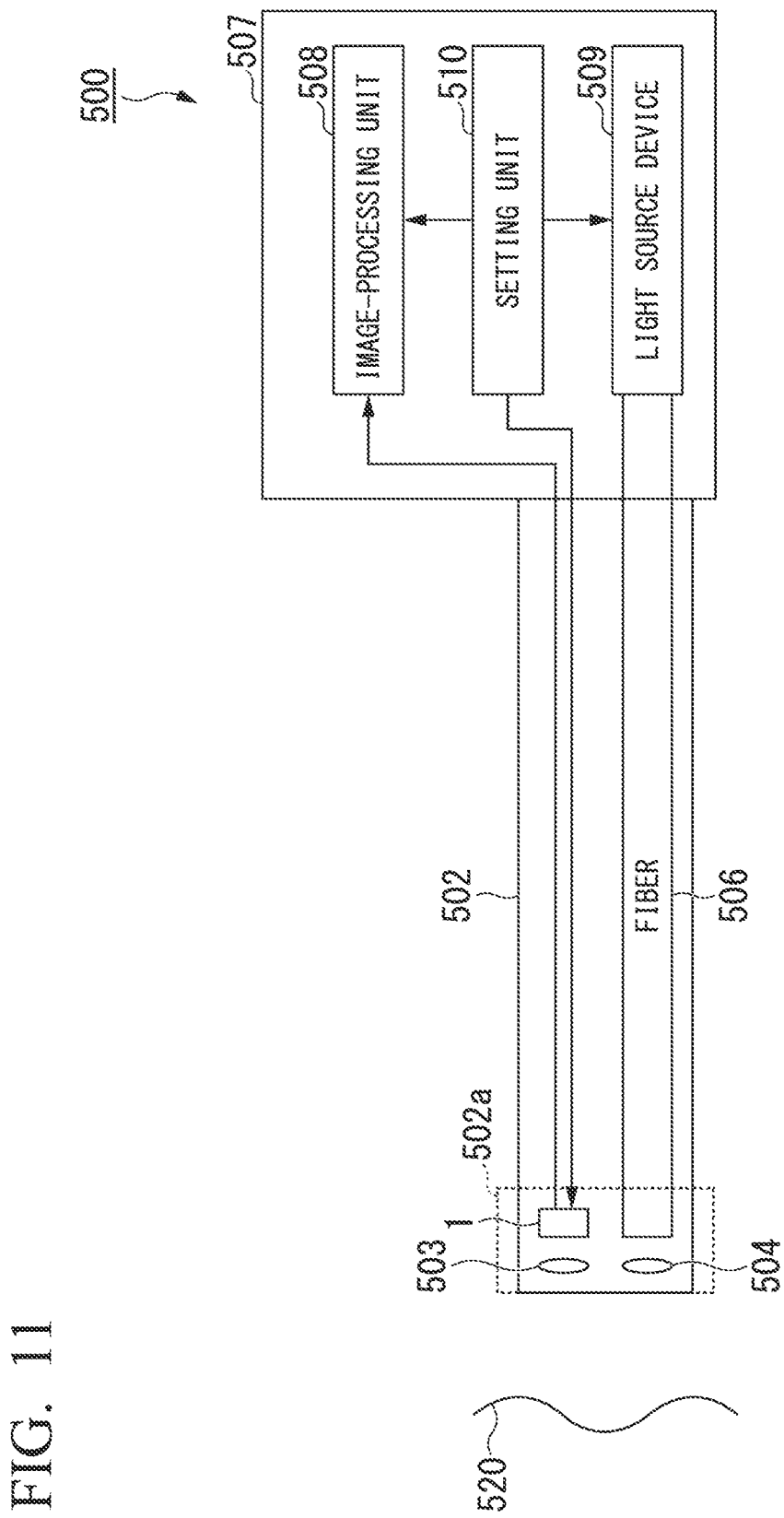
FIG. 11 is a block diagram showing a configuration of an endoscope system according to a fourth embodiment of the present invention.
Figure 12:
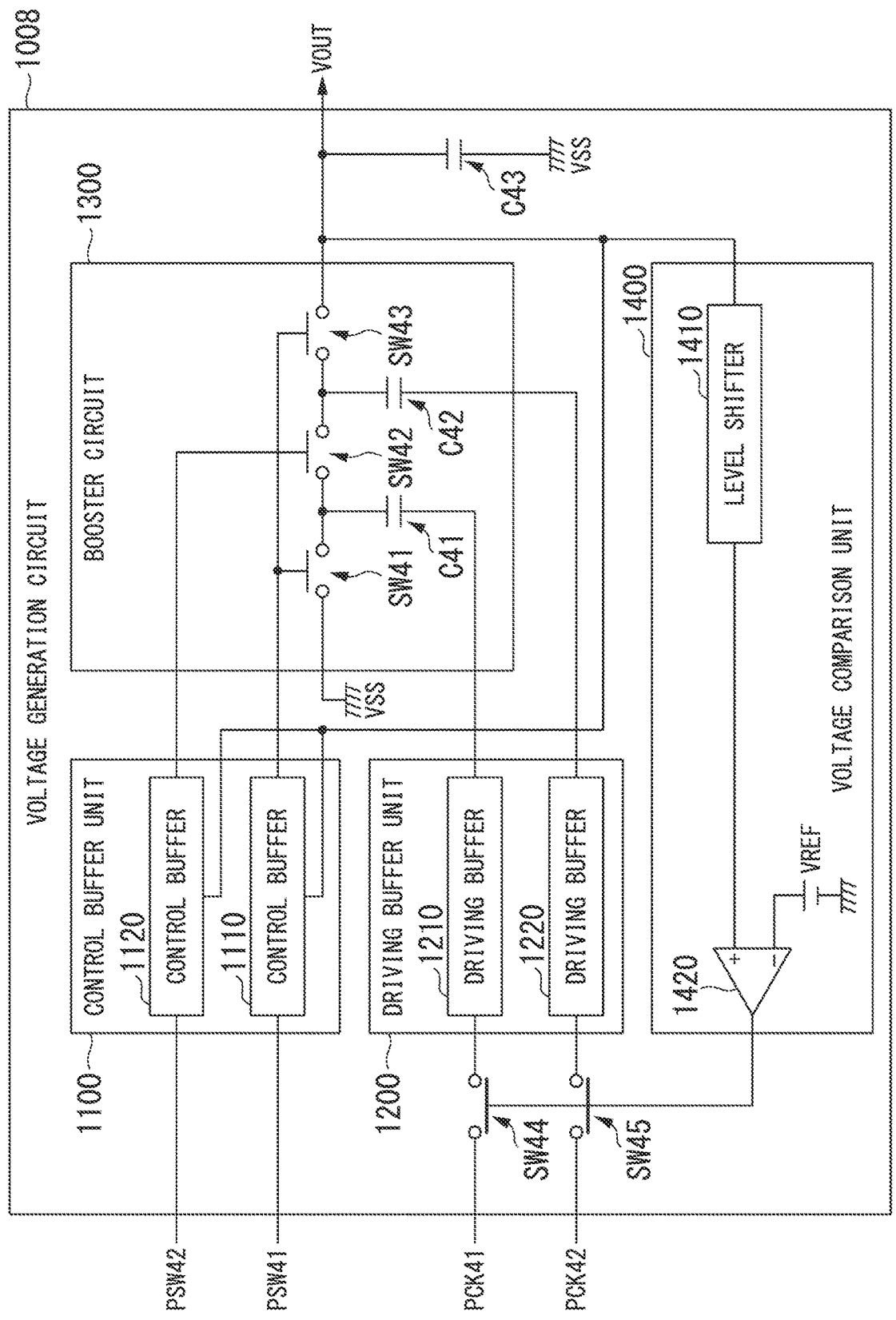
FIG. 12 is a circuit diagram showing a configuration of a voltage generation circuit of the related art.

FIG. 11 shows a configuration of an endoscope system 500 according to a fourth embodiment of the present invention. The endoscope system 500 includes the imaging device according to any one of the first to third embodiments. The endoscope system 500 shown in FIG. 11 includes a scope 502 and a housing 507. The scope 502 includes the imaging device 1 shown in FIG. 1, a lens 503, a lens 504, and a fiber 506. The imaging device 1, the lens 503, and the lens 504 are disposed at a distal end part 502a of the scope 502. The housing 507 includes an image-processing unit 508, a light source device 509, and a setting unit 510.

The lens 503 forms an image of reflected light from a subject 520 on the imaging device 1. The fiber 506 transfers illumination light with which the subject 520 is irradiated. The lens 504 irradiates the subject 520 with the illumination light transferred by the fiber 506. The light source device 509 includes a light source that generates the illumination light with which the subject 520 is irradiated. The image-processing unit 508 generates a captured image by performing predetermined processing on a signal output from the imaging device 1. The setting unit 510 controls an imaging mode of the endoscope system 500.

The configuration of the endoscope system 500 is not limited to the above-described configuration. An endoscope system according to each aspect of the present invention does not need to include a configuration corresponding to at least one of the lens 503, the lens 504, the fiber 506, the image-processing unit 508, the light source device 509, and the setting unit 510.

As described above, the endoscope system 500 includes the scope 502 to be inserted into a living body. The scope 502 includes the imaging device 1. The imaging device 1 is disposed in the distal end part 502a of the scope 502.

In the endoscope system 500 according to the fourth embodiment, the imaging device 1 is suitable for miniaturization. Therefore, the reduction of the thickness of the scope 502 is realized.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A voltage generation circuit, comprising:
a booster circuit including a capacitance element and a transistor;
a control buffer circuit configured to control the transistor; and a driving buffer circuit configured to drive the capacitance element, wherein a power source voltage or a ground voltage is input to the transistor, wherein the power source voltage is a positive voltage, wherein the ground voltage is a lower voltage than the power source voltage, wherein the booster circuit is configured to generate a higher first voltage than the power source voltage or generate a lower second voltage than the ground voltage when the driving buffer circuit drives the capacitance element, wherein the control buffer circuit is configured to control the transistor by using a third voltage that is lower than the first voltage and is higher than the ground voltage in a case in which the booster circuit generates the first voltage, wherein the control buffer circuit is configured to control the transistor by using a fourth voltage that is higher than the second voltage and is lower than or equal to the ground voltage in a case in which the booster circuit generates the second voltage, wherein the control buffer circuit includes a bootstrap circuit, wherein the control buffer circuit is configured to generate a higher voltage than the third voltage and output the generated voltage to the transistor in a case in which the booster circuit generates the first voltage, and wherein the control buffer circuit is configured to generate a lower voltage than the fourth voltage and output the generated voltage to the transistor in a case in which the booster circuit generates the second voltage.

2. The voltage generation circuit according to claim 1, wherein the driving buffer circuit is configured to drive the capacitance element by using a fifth voltage that is lower than the first voltage and is higher than the ground voltage in a case in which the booster circuit generates the first voltage, and wherein the driving buffer circuit is configured to drive the capacitance element by using a sixth voltage that is higher than the second voltage and is lower than or equal to the ground voltage in a case in which the booster circuit generates the second voltage.

3. The voltage generation circuit according to claim 1, wherein the capacitance element is configured to hold the first voltage or the second voltage.

4. The voltage generation circuit according to claim 1, wherein the booster circuit is a charge-pump-type booster circuit including one or more pumping packets, and wherein each of the pumping packets includes the capacitance element and the transistor.

5. An image sensor, comprising:

a voltage generation circuit according to claim 1; and two or more pixels to which the first voltage or the second voltage is input.

6. A scope to be inserted into a living body, the scope including the image sensor according to claim 5, wherein the image sensor is disposed in a distal end of the scope.

7. A voltage generation circuit, comprising:

a booster circuit including a capacitance element and a transistor;

a control buffer circuit configured to control the transistor; and a driving buffer circuit configured to drive the capacitance element, wherein a power source voltage or a ground voltage is input to the transistor, wherein the power source voltage is a positive voltage, wherein the ground voltage is a lower voltage than the power source voltage, wherein the booster circuit is configured to generate a higher first voltage than the power source voltage or generate a lower second voltage than the ground voltage when the driving buffer circuit drives the capacitance element, wherein the control buffer circuit is configured to control the transistor by using a third voltage that is lower than the first voltage and is higher than the ground voltage in a case in which the booster circuit generates the first voltage, wherein the control buffer circuit is configured to control the transistor by using a fourth voltage that is higher than the second voltage and is lower than or equal to the ground voltage in a case in which the booster circuit generates the second voltage, and wherein the transistor is configured as a strong-enhancement-type transistor.

8. The voltage generation circuit according to claim 7, wherein a threshold value of the strong-enhancement-type transistor is greater than or equal to −2 [V] and less than or equal to −1 [V] in a case in which the booster circuit generates the first voltage, and wherein a threshold value of the strong-enhancement-type transistor is greater than or equal to 1 [V] and less than or equal to 2 [V] in a case in which the booster circuit generates the second voltage.

9. A voltage generation circuit, comprising:

a booster circuit including a capacitance element and a transistor;

a control buffer circuit configured to control the transistor; and a driving buffer circuit configured to drive the capacitance element, wherein a power source voltage or a ground voltage is input to the transistor, wherein the power source voltage is a positive voltage, wherein the ground voltage is a lower voltage than the power source voltage, wherein the booster circuit is configured to generate a higher first voltage than the power source voltage or generate a lower second voltage than the ground voltage when the driving buffer circuit drives the capacitance element, wherein the control buffer circuit is configured to control the transistor by using a third voltage that is lower than the first voltage and is higher than the ground voltage in a case in which the booster circuit generates the first voltage, wherein the control buffer circuit is configured to control the transistor by using a fourth voltage that is higher than the second voltage and is lower than or equal to the ground voltage in a case in which the booster circuit generates the second voltage, wherein the booster circuit is a bootstrap-type booster circuit that includes, as the capacitance element, a first capacitance element and a second capacitance element and includes, as the transistor, a first transistor and a second transistor, wherein the first capacitance element includes:

a first terminal into which a direct-current voltage is input; and a second terminal, wherein the second capacitance element includes:
a third terminal connected to the second terminal; and
a fourth terminal connected to the driving buffer circuit,
wherein the power source voltage or the ground voltage is input to the second terminal and the third terminal via the first transistor, and
wherein the second terminal and the third terminal are connected to a third capacitance element via the second transistor.

* * * * *